US007943433B2

(12) United States Patent
Arakawa

(10) Patent No.: US 7,943,433 B2
(45) Date of Patent: May 17, 2011

(54) METHOD OF MANUFACTURING SEMICONDUCTOR DEVICE

(75) Inventor: Hideyuki Arakawa, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/608,712

(22) Filed: Oct. 29, 2009

(65) Prior Publication Data

US 2010/0120207 A1    May 13, 2010

(30) Foreign Application Priority Data

Nov. 13, 2008  (JP) .................................. 2008-291099
Sep. 29, 2009  (JP) .................................. 2009-225056

(51) Int. Cl.
*H01L 21/00*    (2006.01)

(52) U.S. Cl. ........ 438/124; 438/106; 438/126; 438/127; 257/E21.502; 257/E21.506

(58) Field of Classification Search .............. 438/14–48, 438/106–124; 257/666–780, E21.503, E21.705, 257/E21.502, E21.506, E23.179
See application file for complete search history.

(56) References Cited

U.S. PATENT DOCUMENTS

| 6,133,637 A * | 10/2000 | Hikita et al. .................. 257/777 |
| 2002/0149121 A1 | 10/2002 | Shikano et al. |

FOREIGN PATENT DOCUMENTS

| JP | 11067808 A * | 3/1999 |
| JP | 2002-314003 A | 10/2002 |
| JP | 2007-294767 A | 11/2007 |

* cited by examiner

*Primary Examiner* — Alexander G Ghyka
*Assistant Examiner* — Abdulfattah Mustapha
(74) *Attorney, Agent, or Firm* — Miles & Stockbridge P.C.

(57) ABSTRACT

A semiconductor chip has a rectangular main surface with first and second vertices on a diagonal line and first and second sides connecting the first and second vertices. A wire is formed between an electrode and a pad of the semiconductor chip. The wire is enclosed in a cavity of a mold. A liquid resin is poured into the cavity to flow from the first vertex toward the second vertex along the first and second sides. The liquid resin is cured to form a resin portion. The wire is formed such that the wire extends on the side relatively further from the first vertex with respect to a straight line connecting the pad and electrode as seen in plan view. Wires are thus prevented from contacting each other in the process of pouring the liquid resin and accordingly electrical short circuit between the wires can be prevented.

13 Claims, 23 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device, and particularly to a method of manufacturing a semiconductor device having a resin portion encapsulating wires.

2. Description of the Background Art

Semiconductor packages can be classified in terms of the encapsulation structure into two types, namely hermetically encapsulated packages and non-hermetically encapsulated packages. In particular, transfer molded plastic packages belonging to the non-hermetically encapsulated packages are now dominantly used.

Japanese Patent Laying-Open No. 2002-314003 for example discloses the transfer molded plastic packaging technology. A method of manufacturing a semiconductor device according to the technology includes the following steps.

On a resin frame, an IC chip is secured with a die bonding material. By wire bonding, a bonding pad on the IC chip and a land of the resin frame are electrically connected. A mold is used to perform transfer molding to encapsulate the IC chip in a resin.

In the case where a chip having many and densely arranged bonding pads like a chip of the SoC (System on Chip) type is used, wires connected respectively to the bonding pads are also formed densely. In a transfer molding process, these wires are forced to be shifted to some extent by a fluid mold resin. A problem here is that a certain wire could be forced to be shifted to a particularly greater extent to be brought into contact with the wire located downstream, resulting in electrical short circuit between the wires.

SUMMARY OF THE INVENTION

The present invention has been made in view of the problem above, and an object of the present invention is to provide a method of manufacturing a semiconductor device with which electrical short circuit between wires can be avoided by preventing contact between wires that could occur in a process of pouring a liquid resin.

According to a method of manufacturing a semiconductor device in an embodiment of the present invention, the semiconductor device includes: a semiconductor chip having a rectangular main surface with first and second vertices on a diagonal line and first and second sides connecting the first and second vertices and having a first pad on the main surface; an electrode; a wire connecting the first pad and the electrode; and a resin portion encapsulating the wire. The method includes the following steps.

The wire is formed between the first pad and the electrode. The wire is enclosed in a cavity of a mold. A liquid resin is poured into the cavity such that the liquid resin flows from the first vertex toward the second vertex along the first and second sides. The resin portion is formed by curing the liquid resin. The wire is formed such that the wire extends on a side relatively further from the first vertex with respect to a straight line connecting the first pad and the electrode as seen in plan view.

According to a method of manufacturing a semiconductor device in another embodiment of the present invention, the semiconductor device includes: a first semiconductor chip having a quadrilateral main surface with first and second sides sharing a common vertex and having a group of pads on the main surface; a group of electrodes; a group of wires connecting the group of pads and the group of electrodes; and a resin portion encapsulating the group of wires. The method includes the following steps. The group of wires is formed between the group of pads and the group of electrodes. The step of forming the group of wires includes the step of forming a first wire of the group of wires between a first pad of the group of pads and a first electrode of the group of electrodes, the first wire crossing the second side as seen in plan view. The group of wires is enclosed in a cavity of a mold. A liquid resin is poured into the cavity. The step of pouring the liquid resin is performed such that the liquid resin flows to a position along the second side via a position along the first side and a position around the vertex in order. The resin portion is formed by curing the liquid resin. The step of forming the first wire is performed by forming the first wire such that the first wire extends on a side relatively closer to the vertex with respect to a straight line connecting the first pad and the first electrode as seen in plan view.

According to the method of manufacturing a semiconductor device in the one embodiment as described above, the wire is formed to extend on the side relatively further from the first vertex of the semiconductor chip with respect to a straight line connecting the first pad and the electrode, namely on the downstream side of the flow of the liquid resin. Thus, the difference between wires in terms of the extent to which the wires are forced to be shifted by the liquid resin from the upstream side toward the downstream side can be reduced. Since a certain wire is prevented from being forced to be shifted to a relatively greater extent to contact another wire, electrical short circuit between the wires can be prevented.

According to the method of manufacturing a semiconductor device in the other embodiment as described above, the first wire is formed to extend on the side relatively closer to the first vertex of the semiconductor chip with respect to a straight line connecting the first pad and the first electrode, namely on the upstream side of the flow of the liquid resin. Thus, a relatively large space can be provided between the first wire and the wire located on the downstream side of the liquid resin flow, and electrical short circuit between the wires can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter with reference to the drawings.

First Embodiment

Figure 1:
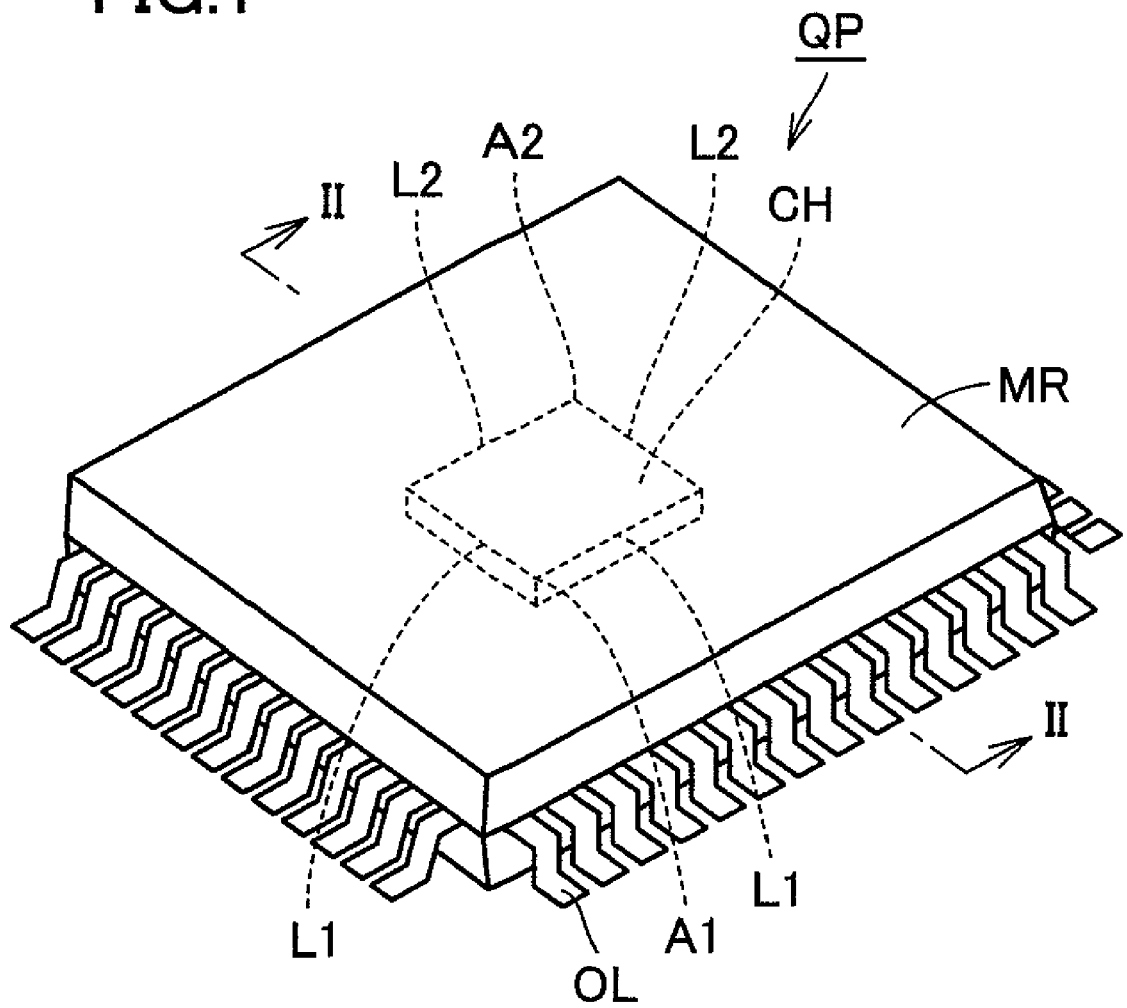
FIG. 1 is a perspective view schematically showing a structure of a semiconductor device in a first embodiment of the present invention.

Referring to FIG. 1, a semiconductor device in the present embodiment is a transfer-molded-type plastic package QP that is for example QFP (Quad Flat Package). Package QP of this type includes outer leads OL protruding from each of the four sides of the perimeter of a resin portion MR encapsulating a semiconductor chip CH. Semiconductor chip CH has a rectangular main surface (upper surface in the drawing). The main surface has first and second vertices A1, A2 and first and second sides L1, L2. First and second vertices A1, A2 are located respectively at the opposite ends of a diagonal line. First and second sides L1, L2 connect first and second vertices A1, A2.

Referring to FIGS. 2 to 5, semiconductor chip CH as described above, a lead frame LF and a bonding wire WR are arranged in resin portion MR.

Semiconductor chip CH has a bonding pad PD on the main surface. Bonding pad PD includes an inner bonding pad PD1 (first pad) located on the relatively inner side of the main surface and an outer bonding pad PD2 (second pad) located on the relatively outer side of the main surface. The distance between the outer perimeter of the main surface and outer bonding pad PD2 is smaller than the distance between the outer perimeter and inner bonding pad PD1.

Figure 2:
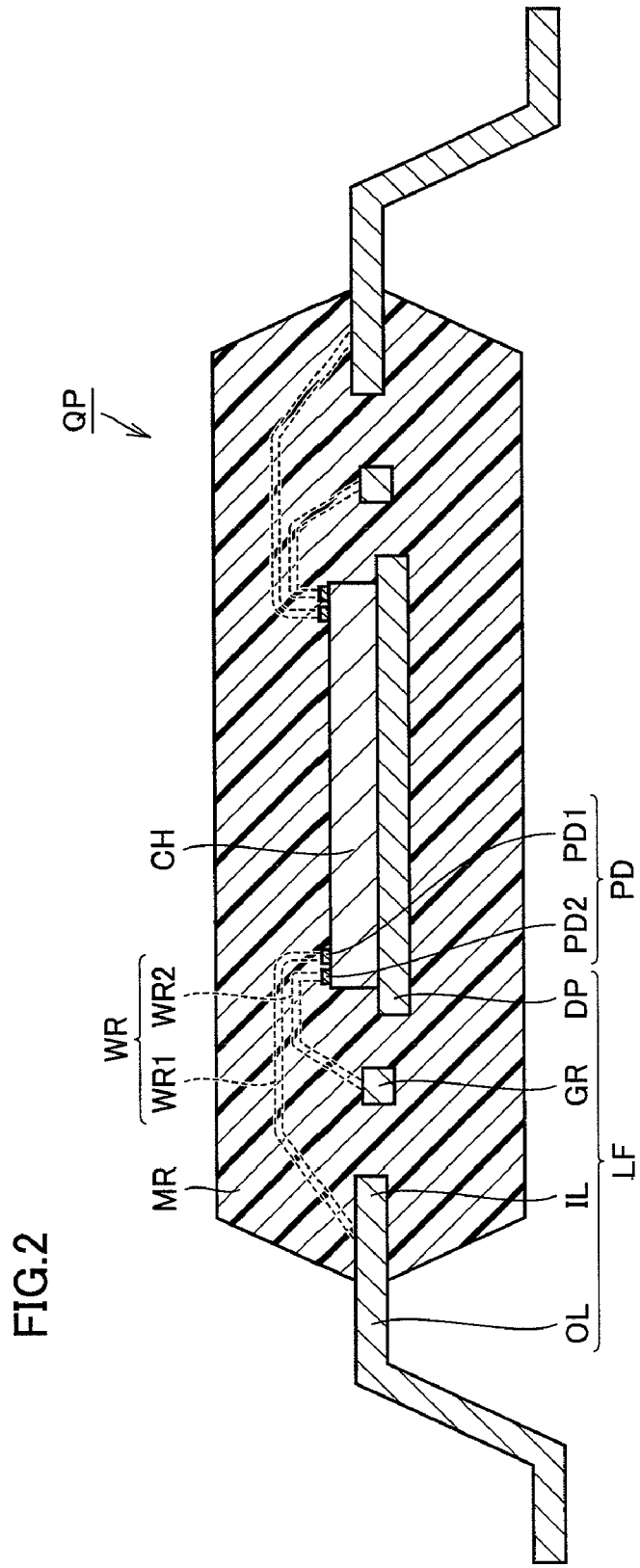
FIG. 2 is a schematic cross section along line II-II in FIG. 1.
Figure 3:
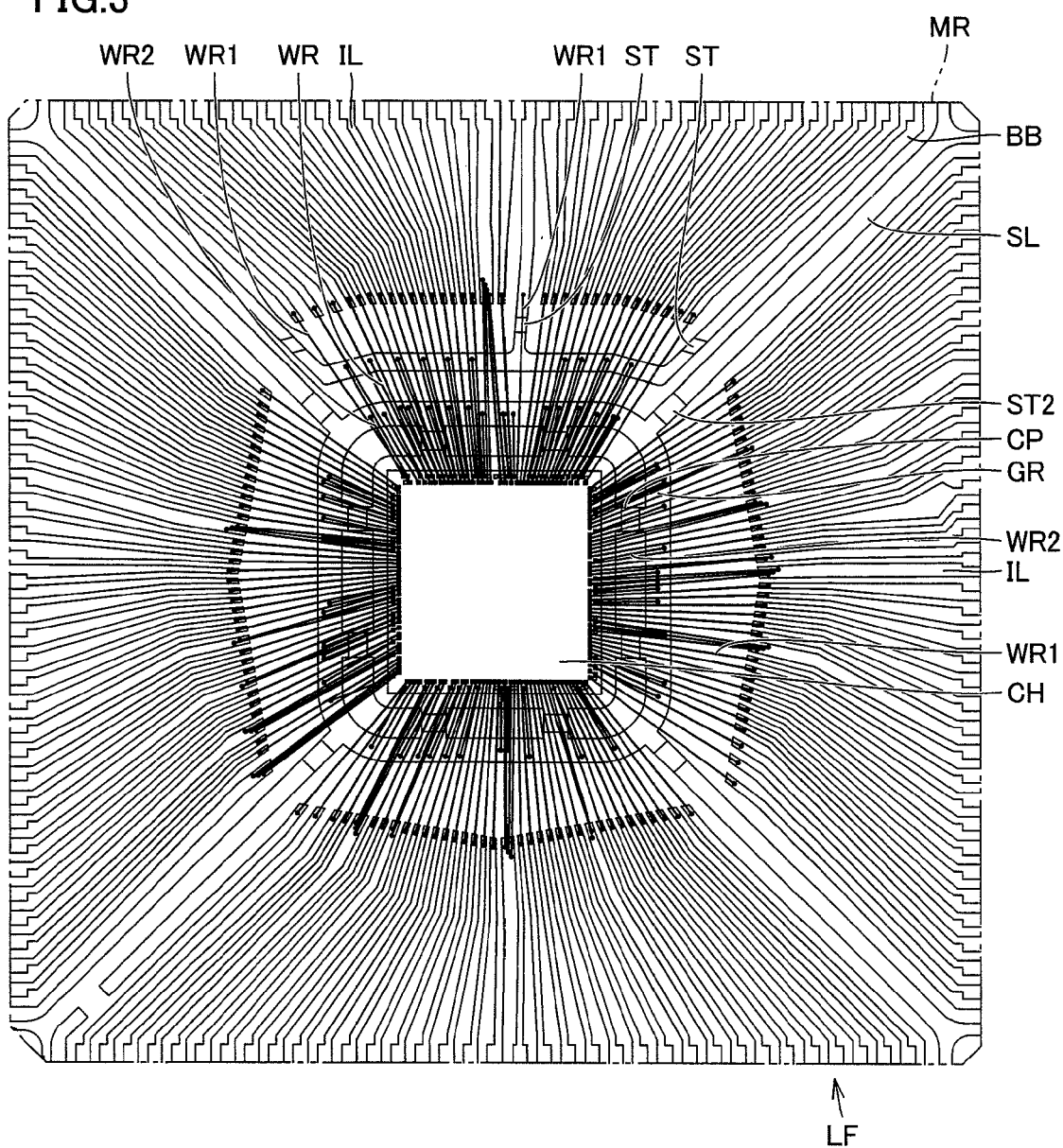
FIG. 3 is a plan view schematically showing an inner structure of a resin portion in FIG. 1.
Figure 4:
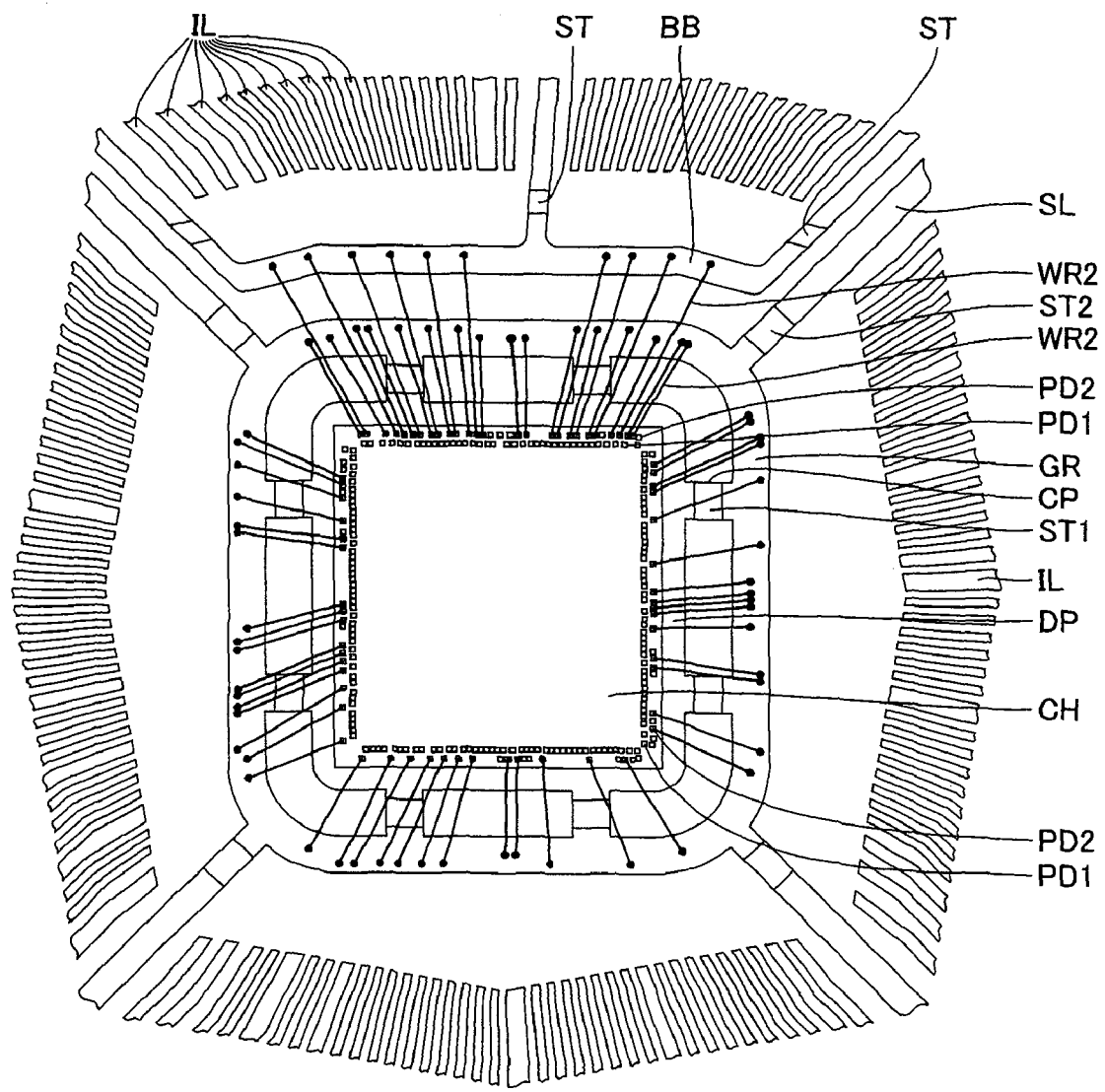
FIG. 4 is a plan view for illustrating arrangement of bonding wires connected to outer bonding pads of a semiconductor chip, among bonding wires in FIG. 3.

Bonding wire WR includes an inner bonding wire WR1 and an outer bonding wire WR2. Inner bonding wire WR1 connects inner bonding pad PD1 and lead frame LF. Outer bonding wire WR2 connects outer bonding pad PD2 and lead frame LF. As shown in FIG. 2, inner bonding wire WR1 is disposed to extend over and to a further extent than outer bonding wire WR2. The height of inner bonding wire WR1 is therefore larger than the height of outer bonding wire WR2.

Lead frame LF includes, on the inside of resin portion MR, a die pad DP, a plurality of inner leads IL (electrodes), a bus bar BB, a ground ring GR, a connecting portion CP, and a suspension lead SL, and includes outer leads OL (electrodes) on the outside of resin portion MR.

Die pad DP is located substantially at the center of lead frame LF. Semiconductor chip CH is mounted on die pad DP with an adhesive applied therebetween.

A plurality of inner leads IL are used for communicating input and output signals to and from semiconductor chip CH, and are arranged to extend radially from semiconductor chip CH, for example. Respective leading ends of a plurality of inner leads IL are located on the outer side relative to respective outer perimeters of die pad DP and semiconductor ship CH as seen in plan view.

Bus bar BB is used for supplying a power supply potential to semiconductor chip CH, for example. Bus bar BB includes a bent portion ST.

Ground ring GR is used for supplying a ground potential to semiconductor chip CH. Ground ring GR is located on the outer side relative to the outer perimeter of die pad DP and located on the inner side relative to the circumferentially extending portion of bus bar BB as seen in plan view. Ground ring GR is positioned to surround the whole periphery of die pad DP. Between ground ring GR and die pad DP, a bent portion ST1 is formed that is bent so that the upper surface of die pad DP is lower than the upper surface of ground ring GR. Between ground ring GR and suspension lead SL, a bent portion ST2 is formed that is bent so that the upper surface of ground ring GR is lower than the upper surface of suspension lead SL.

Connecting portion CP serves to connect die pad DP and ground ring GR. Two connecting portions for example are provided per side of die pad DP as seen in plan view. Suspension leads SL are connected respectively to the four corners of ground ring GR and extended outward from the portion where suspension leads SL and ground ring GR are connected.

Some of outer bonding pads PD2 are electrically connected by outer bonding wires WR2 to the circumferentially extending portion of bus bar BB. Some of the remaining outer bonding pads PD2 are electrically connected by outer bonding wires WR2 to ground ring GR.

Some of inner bonding pads PD1 are electrically connected by inner bonding wires WR1 to inner leads IL. One, for example, of inner bonding pads PD1 is electrically connected by inner bonding wire WR1 to the radially extending portion of bus bar BB.

Referring chiefly to FIGS. 6 to 11, lead frame LF is prepared first. Next, semiconductor chip CH is attached onto die pad DP of lead frame LF with an adhesive or the like applied therebetween.

Then, bonding wire WR is formed to extend from bonding pad PD to lead frame LF and thereby connect bonding pad PD and lead frame LF by wire bonding. More specifically, outer bonding wire WR2 extending from outer bonding pad PD2 to lead frame LF is formed first, and subsequently inner bonding wire WR1 extending from inner bonding pad PD1 to lead frame LF is formed.

Bonding wire WR is formed in such a way as to extend on the side relatively further from vertex A1 (FIG. 1) (toward the side in the direction indicated by arrow M in FIGS. 10 and 11) as seen in plan view, with respect to the straight line (broken lines in FIGS. 10 and 11) connecting bonding pad PD and lead frame LF. Arrow M corresponds to the direction in which a liquid resin as described later flows.

Bonding wire WR includes sections Wa to Wc. Section Wa extends from bonding pad PD in the direction substantially perpendicular to bonding pad PD. Section Wb connects section Wa and section Wc. Section Wc connects section Wb and lead frame LF, inner lead IL for example. A bent point F is formed between section Wb and section Wc in the wire bonding process.

Figure 8:
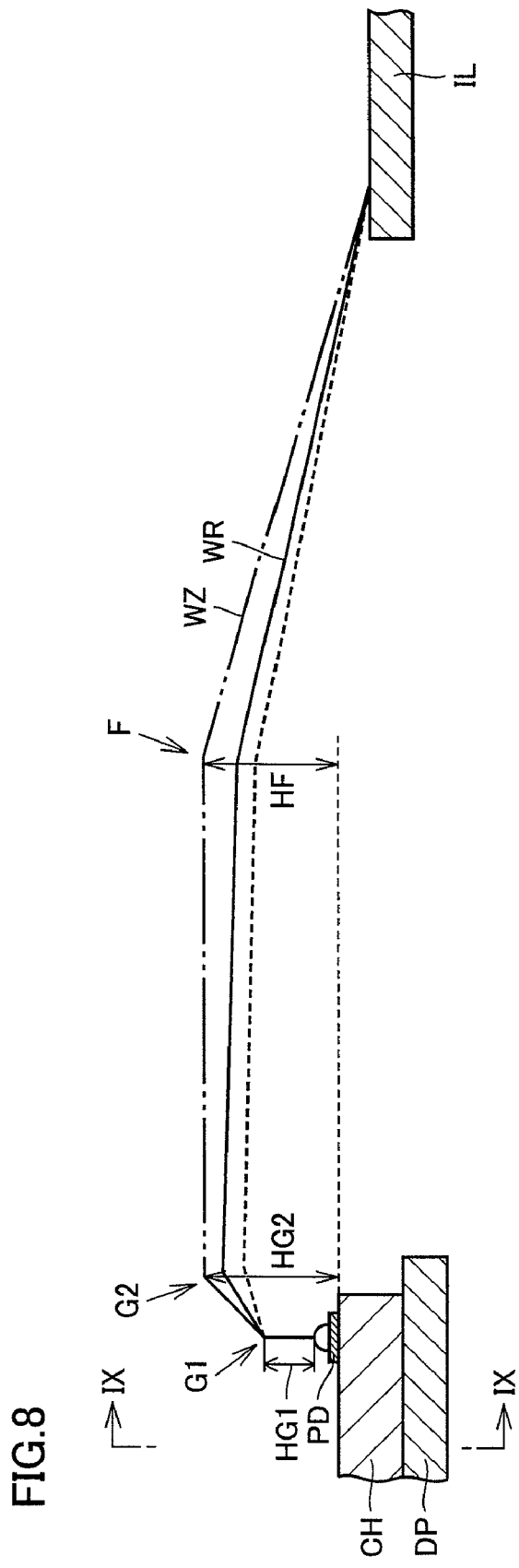
FIG. 8 is a schematic cross section for illustrating the height of the bonding wire in FIG. 7.

The shape of bonding wire WR varies in the direction of height. More specifically, as shown in FIG. 8, bonding wire WR extending from bonding pad PD to inner lead IL is bent at points G1, G2 and F in this order. The portion of bonding wire WR running from bonding pad PD to bent point G1 corresponds to section Wa, the portion running from bent point G1 to bent point F via bent point G2 corresponds to section Wb, and the portion running from bent point F to inner lead IL corresponds to section Wc.

Respective heights at bent points G1, G2 and F (FIG. 8) from the surface of semiconductor chip CH are HG1, HG2 and HF. Heights HG1, HG2 and HF of bonding wire WR are respectively 80 μm, 195 μm and 175 μm for example.

Figure 9:
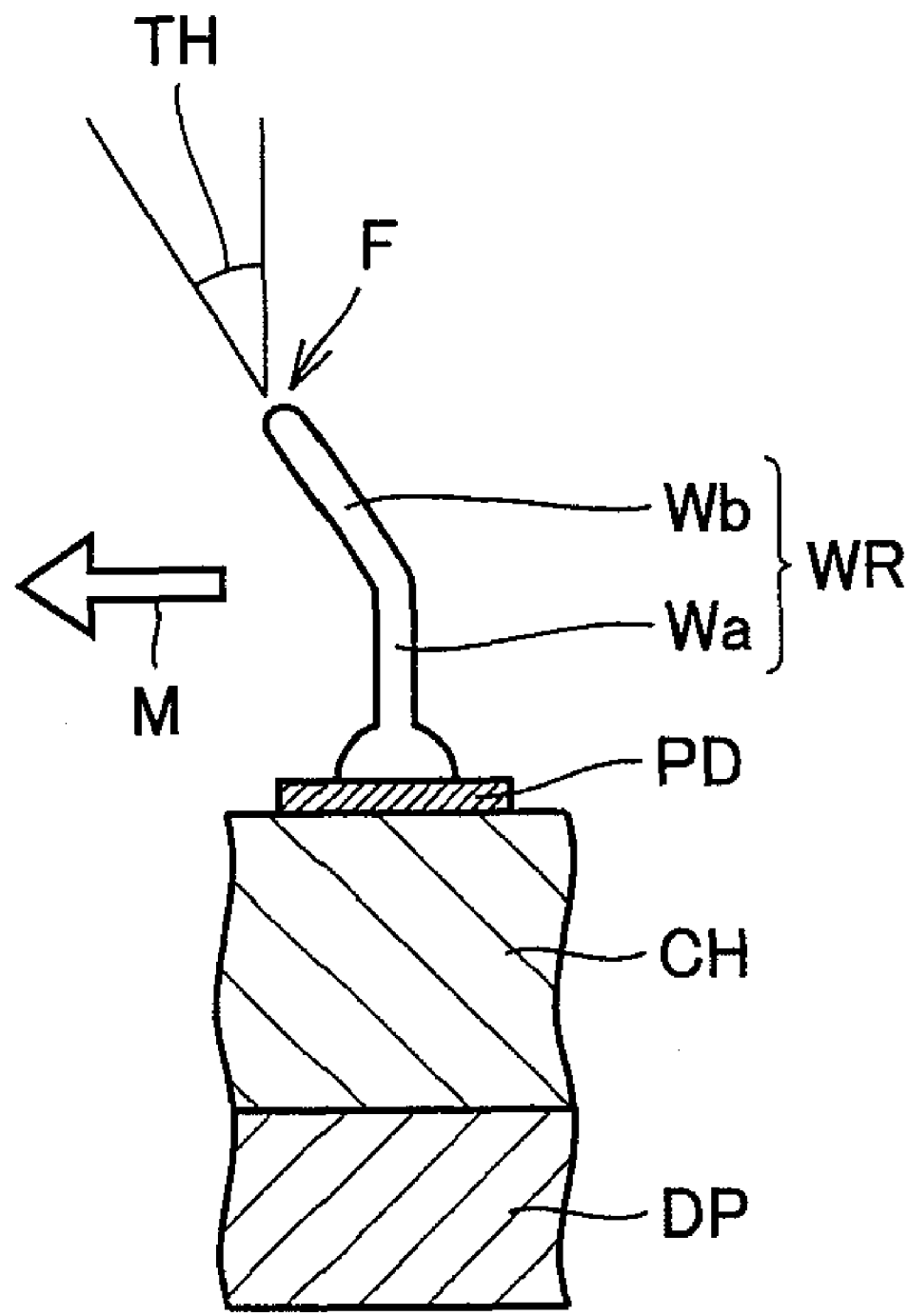
FIG. 9 is a schematic partial cross section along line IX-IX in FIG. 7.
Figure 10:
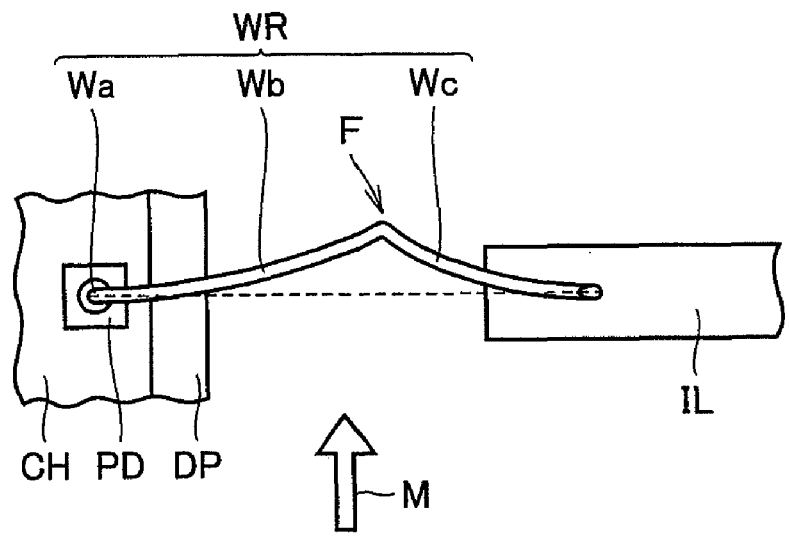
FIG. 10 is a schematic partial plan view as seen in the direction of arrow X in FIG. 7.
Figure 11:
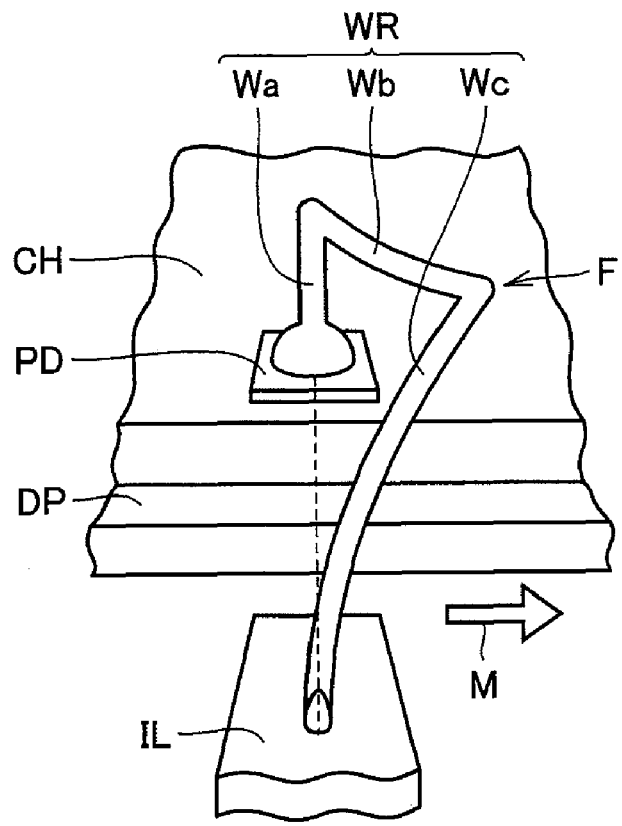
FIG. 11 is a schematic partial perspective view as seen in the direction of arrow XI in FIG. 7.

Bent point F is formed in such a way as to be located on the side relatively further from first vertex A1 (FIG. 1) (upper side in FIG. 10 and right side in FIG. 11) with respect to the straight line (broken lines in FIGS. 10 and 11) connecting bonding pad PD and lead frame LF as seen in plan view. Further, as shown in FIG. 9, bonding wire WR in the vicinity of bent point F extends along the plane inclined by angle TH with respect to the normal line to the main surface of semiconductor chip CH. Angle TH is 20 degrees for example.

Figure 12:
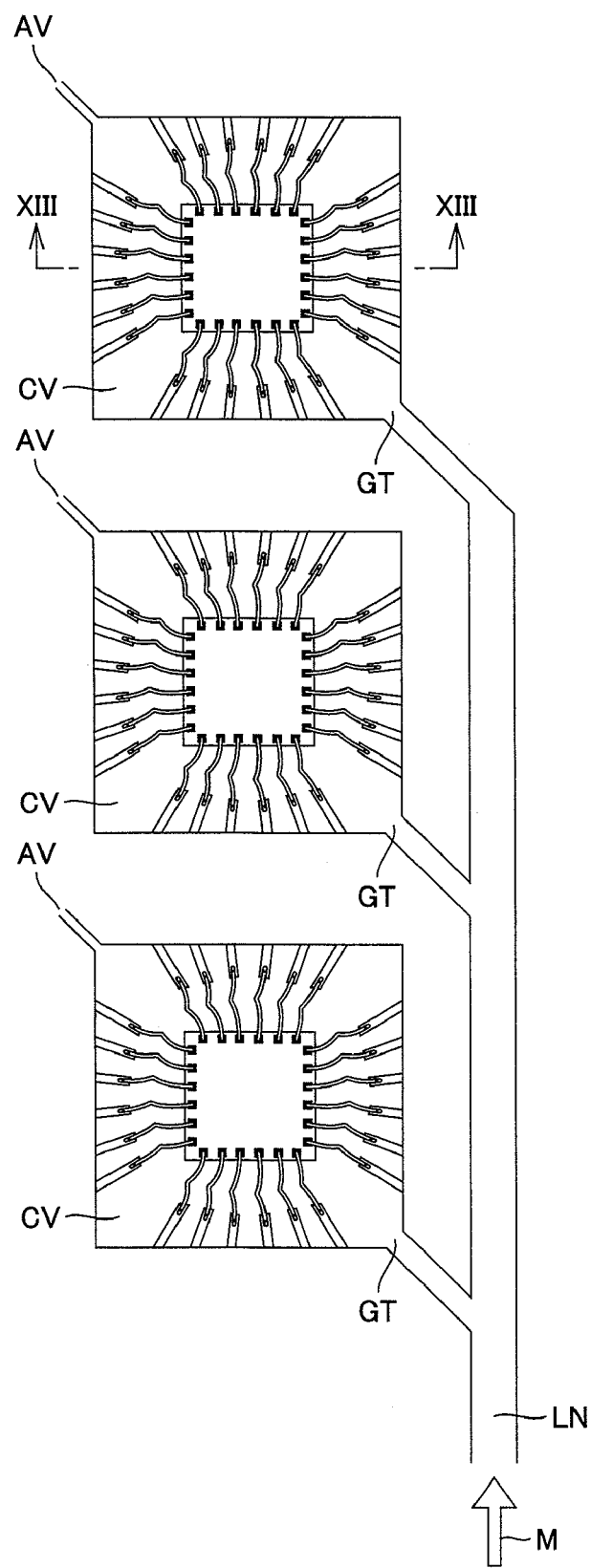
FIG. 12 is a partial plan view schematically showing a second step of the method of manufacturing a semiconductor device in the first embodiment of the present invention.
Figure 13:
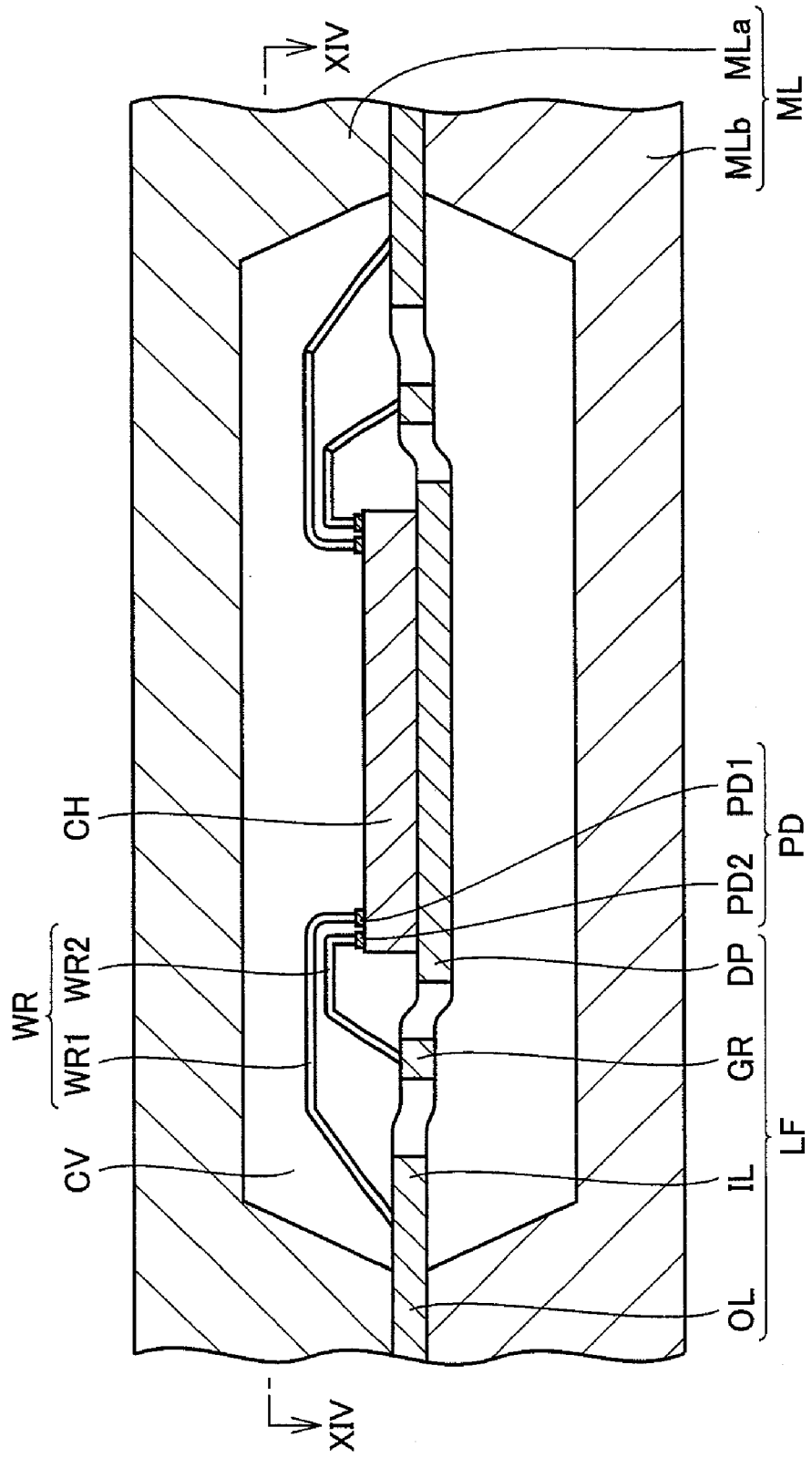
FIG. 13 is a schematic partial cross section along line XIII-XIII in FIG. 12.
Figure 14:
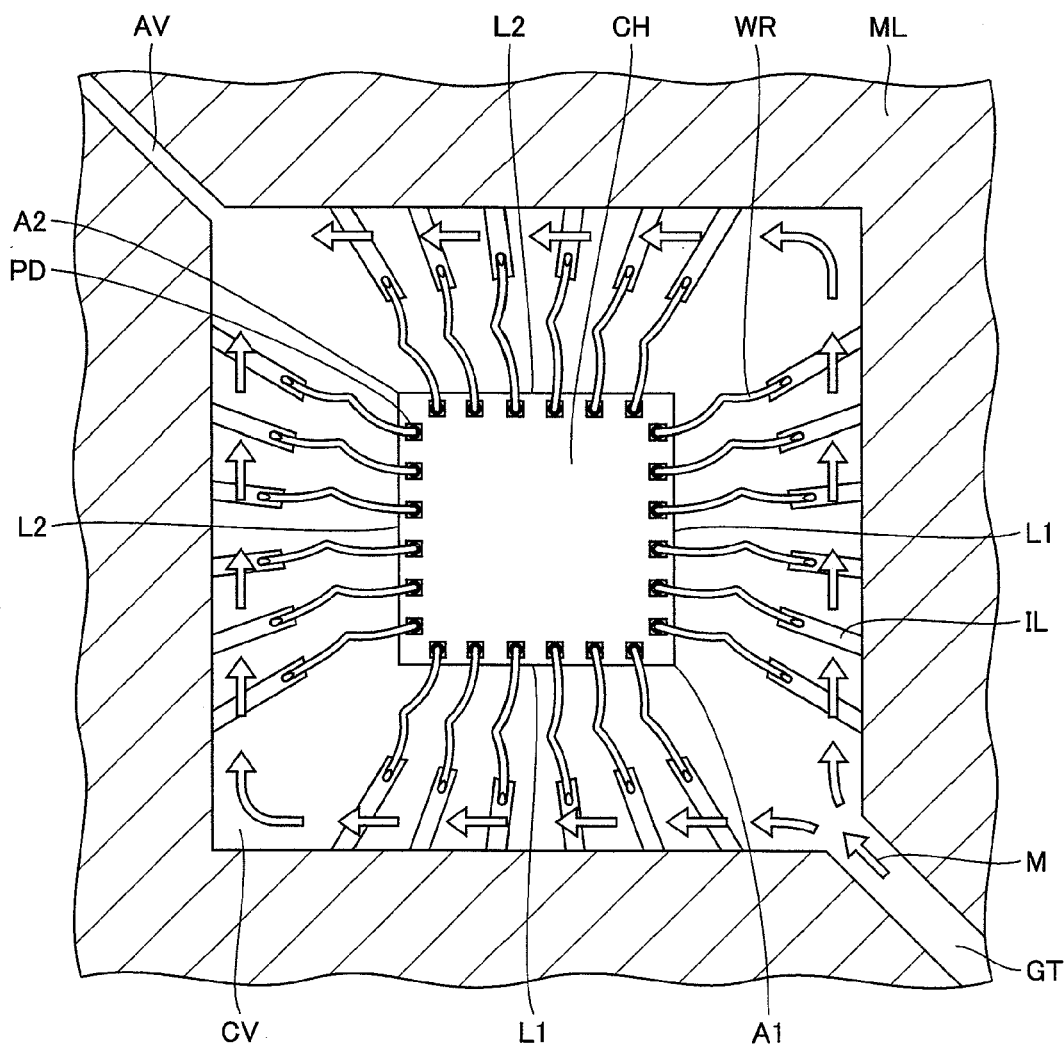
FIG. 14 is a schematic partial cross section along line XIV-XIV in FIG. 13.

Referring to FIGS. 12 to 14, a mold ML adapted to transfer molding is prepared. Mold ML includes an upper mold MLa and a lower mold MLb. Upper mold MLa and lower mold MLb are shaped so that a cavity CV is formed between upper mold MLa and lower mold MLb positioned opposite to each other.

Then, outer lead OL is held between upper mold MLa and lower mold MLb. Bonding wire WR is accordingly enclosed in cavity CV.

Subsequently, a liquid resin is poured into cavity CV in the direction as indicated by arrow M (FIGS. 12 and 14) from first vertex A1 (FIG. 14) along first and second sides L1, L2 toward second vertex A2. The poured liquid resin causes angle TH (FIG. 9) to increase, for example, from 20 degrees by 10±5 degrees to 30±5 degrees. In other words, the dispersion of respective increases of angle TH of respective bonding wires WR is approximately ±5 degrees.

Referring to FIG. 8, the poured liquid resin also causes heights HG2 and HF of bonding wire WR to decrease. For example, height HG2 decreases from 195 μm to 170 μm, and height HF decreases from 175 μm to 165 μm.

The liquid resin is cured to form resin portion MR (FIG. 1). Then, outer lead OL (FIG. 1) is cut and bent. The semiconductor device in the present embodiment is thus produced.

A comparative example of the present embodiment will now be described.

Figure 15:
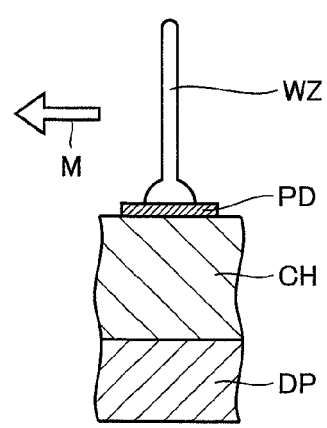
FIG. 15 is a partial cross section schematically illustrating a first step of a method of manufacturing a semiconductor device in a comparative example, to be compared with FIG. 9 of the present embodiment.
Figure 16:
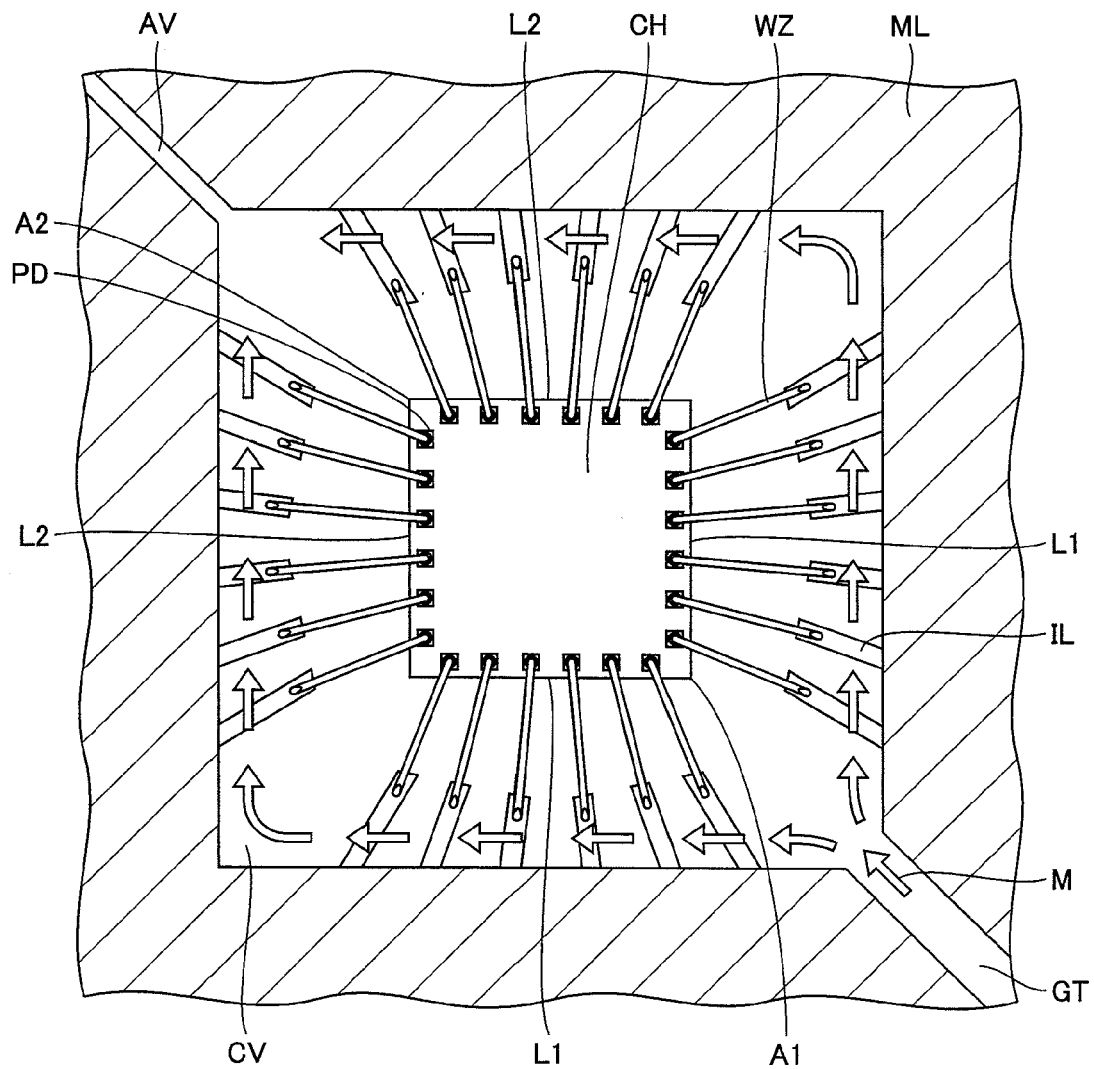
FIG. 16 is a partial cross section schematically illustrating a first step of the method of manufacturing a semiconductor device in the comparative example, to be compared with FIG. 14 of the present embodiment.

Referring to FIGS. 15 and 16, a bonding wire WZ of this comparative example differs from bonding wire WR (FIG. 9) in the present embodiment in that, at the stage before a liquid resin is poured, the former does not have an inclination (inclination defined by angle TH in FIG. 9) with respect to the main surface of semiconductor chip CH. Bonding wire WZ is therefore linear in plan view as shown in FIG. 16. Here, heights HG1, HG2 and HF (FIG. 8) of bonding wire WZ are respectively 80 μm, 200 μm and 200 μm for example.

Figure 17:
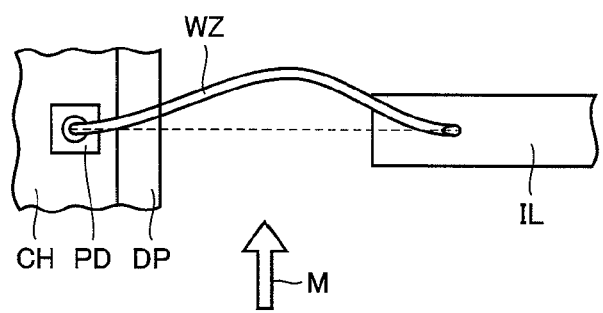
FIG. 17 is a partial plan view schematically illustrating a second step of the method of manufacturing a semiconductor device in the comparative example.
Figure 18:
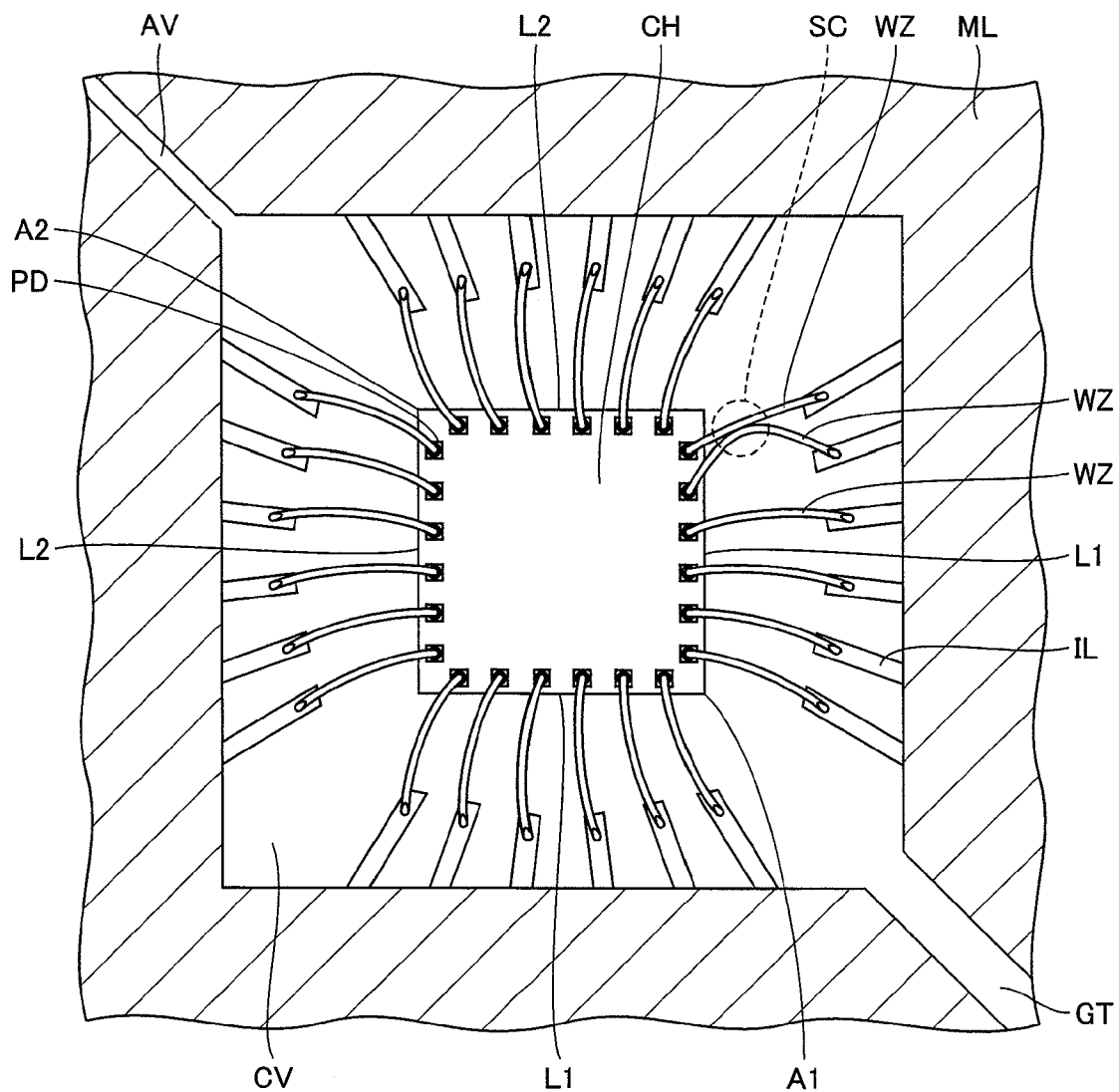
FIG. 18 is a partial cross section schematically illustrating the second step of the method of manufacturing a semiconductor device in the comparative example.

Referring to FIGS. 17 and 18, when a liquid resin is poured for bonding wire WZ in the direction of arrow M, bonding wire WZ is forced to be shifted to curve in the direction of arrow M in plan view as shown in FIG. 17. Accordingly, the shape of bonding wire WZ somewhat, resembles the shape shown in FIG. 9, while the dispersion of respective angles TH (FIG. 9) of bonding wires WZ is larger than that of the present embodiment. Specifically, after the liquid resin is poured, respective angles TH (FIG. 9) of bonding wires WZ are, for example, 30±20 degrees. In the present embodiment, angles TH are 30±5 degrees. Namely, the dispersion of respective angles TH of bonding wires WZ is larger than that of the present embodiment.

As seen from above, bonding wires WZ are forced to be shifted by the liquid resin to respective extents that are greatly different from each other, which is likely to result in short circuit SC due to contact between bonding wires WZ as shown in FIG. 18. This short circuit SC causes failure of the semiconductor device.

Referring to FIG. 8, the poured liquid resin also causes heights HG2 and HF of bonding wire WZ to decrease. For example, height HG2 decreases from 200 μm to 170 μm and height HF decreases from 200 μm to 165 μm. In other words, at the stage where the liquid resin has been poured completely, the average height of bonding wire WZ of the comparative example and the average height of bonding wire WR of the present embodiment are almost equal to each other. The reason is supposed to be as follows. When the height of the bonding wire is decreased to a certain extent, the force of the flow of the liquid resin and the tension of the bonding wire are balanced, so that the displacement of the bonding wire is stopped.

The final angle TH (FIG. 9) of bonding wire WR of the present embodiment and the final angle TH of bonding wire WZ of the comparative example are almost equal to each other, and are each 30° on average for example. The reason why respective angles TH of the present embodiment and the comparative example are almost equal to each other is supposed to be as follows. When the height of the bonding wire is decreased to a certain extent, the displacement of the bonding wire is stopped as described above. In addition, bending of bent point F (FIG. 9) is supposed to have some influence. The specific reason is supposed to be as follows.

It is assumed here that there is an imaginary plane including a bent portion of the bonding wire in the vicinity of bent point F. As angle TH (FIG. 9) is caused to increase by the flow of the liquid resin, the direction of the flow of the liquid resin becomes close to the in-plane direction of the imaginary plane. Consequently, the bent portion including bent point F acts against the flow of the liquid resin, with a greater force than before. Therefore, when angle TH is increased to a certain degree, the bent portion including bent point F acting against the flow of the liquid resin is not deformed any more. Accordingly, the increase of angle TH is stopped when the angle reaches a specific angle (approximately 30° for example).

According to a method of manufacturing a semiconductor device in the present embodiment, bonding wire WR is formed in such a way as to extend on the side relatively further from first vertex A1 of semiconductor chip CH, with respect to the straight line (broken lines in FIGS. 10 and 11) connecting bonding pad PD and inner lead IL for example of lead frame LF, namely extend downstream of the flow of the liquid resin (in the direction of arrow M). In this way, the dispersion is decreased of bonding wires WR in terms of the extent to which bonding wires WR are forced to be shifted by the liquid resin from the upstream side to the downstream side. Since a certain bonding wire WR is thus prevented from being shifted relatively further downstream to contact another bonding wire WR, electrical short circuit SC (FIG. 18) between these bonding wires WR can be prevented.

According to the present embodiment, inner bonding wire WR1 is made higher than outer bonding wire WR2. The present embodiment can prevent short circuit of inner bonding wire WR1 which is likely to be shifted by the liquid resin due to the relatively greater height.

Figure 5:
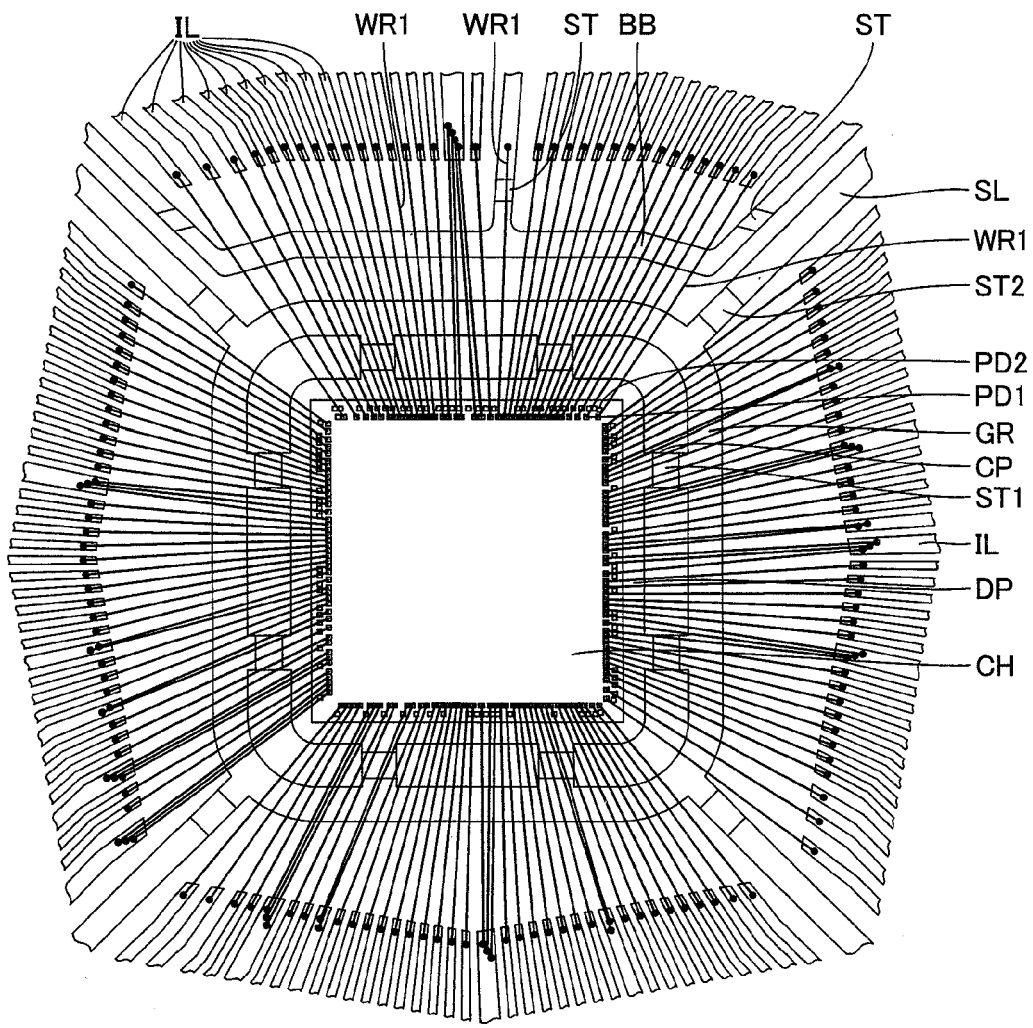
FIG. 5 is a plan view for illustrating arrangement of bonding wires connected to inner bonding pads on the semiconductor chip, among bonding wires in FIG. 3.
Figure 6:
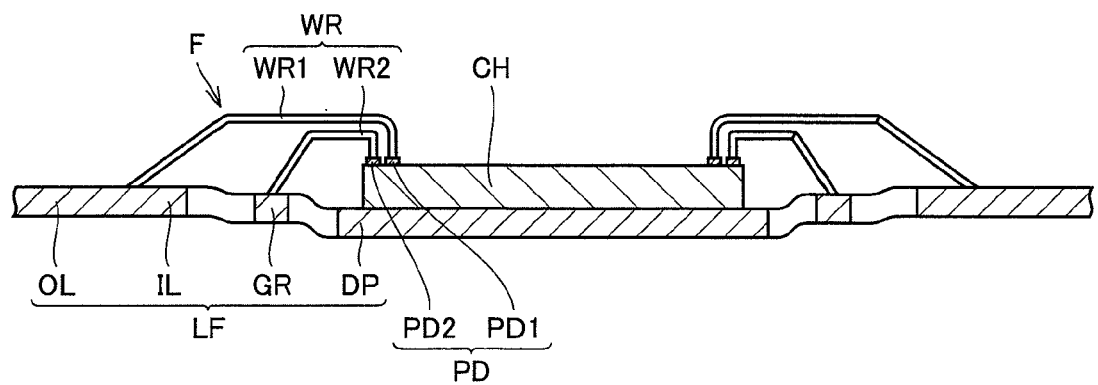
FIG. 6 is a partial cross section for schematically illustrating a first step of a method of manufacturing a semiconductor device in the first embodiment of the present invention.
Figure 7:
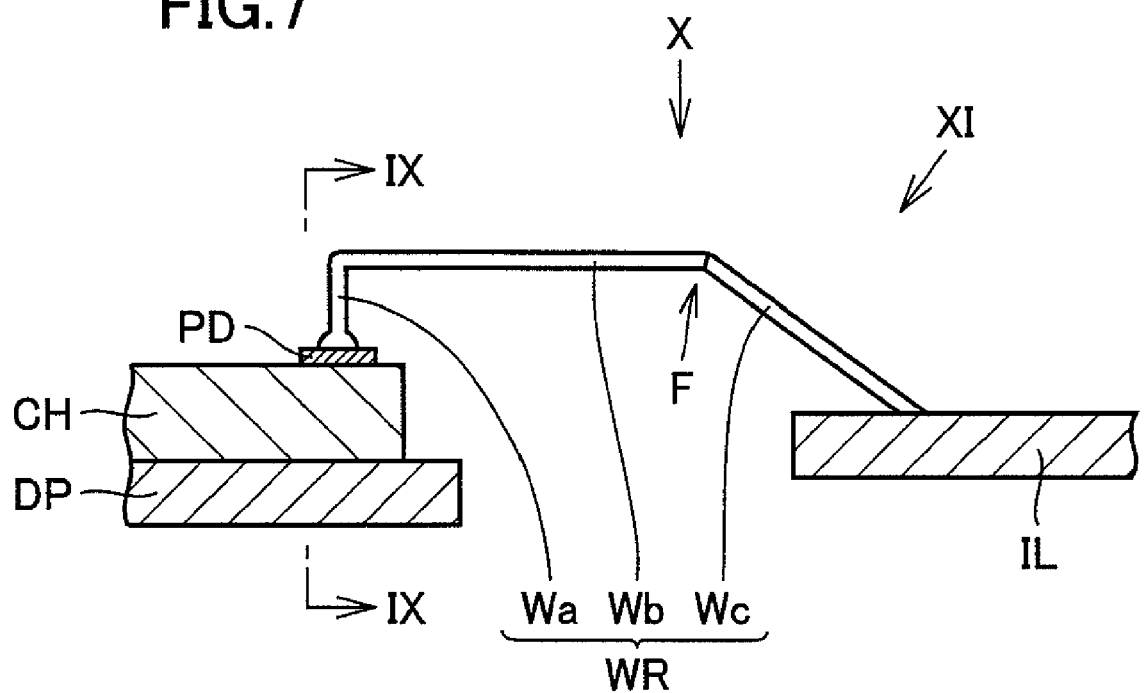
FIG. 7 is a schematic partial cross section for illustrating the shape of a bonding wire in FIG. 6.

Further, according to the present embodiment, a part of inner bonding wires WR1 is provided to the extent that allows inner bonding wire WR1 to run beyond ground ring GR as shown in FIG. 5. The present embodiment can prevent short circuit of inner bonding wire WR1 which is likely to be shifted by the liquid resin due to the relatively greater length.

Further, according to the present embodiment, a part of inner bonding wires WR1 is provided to the extent that allows inner bonding wire WR1 to run beyond bus bar BB as shown in FIG. 5. The present embodiment can prevent short circuit of inner bonding wire WR1 which is likely to be shifted by the liquid resin due to the relatively greater length.

Further, according to the present embodiment, lead frame LF includes outer leads OL. A package, like QFP for example, having external electrodes protruding from resin portion MR can thus be formed.

A modification of the present embodiment will now be described.

Figure 19:
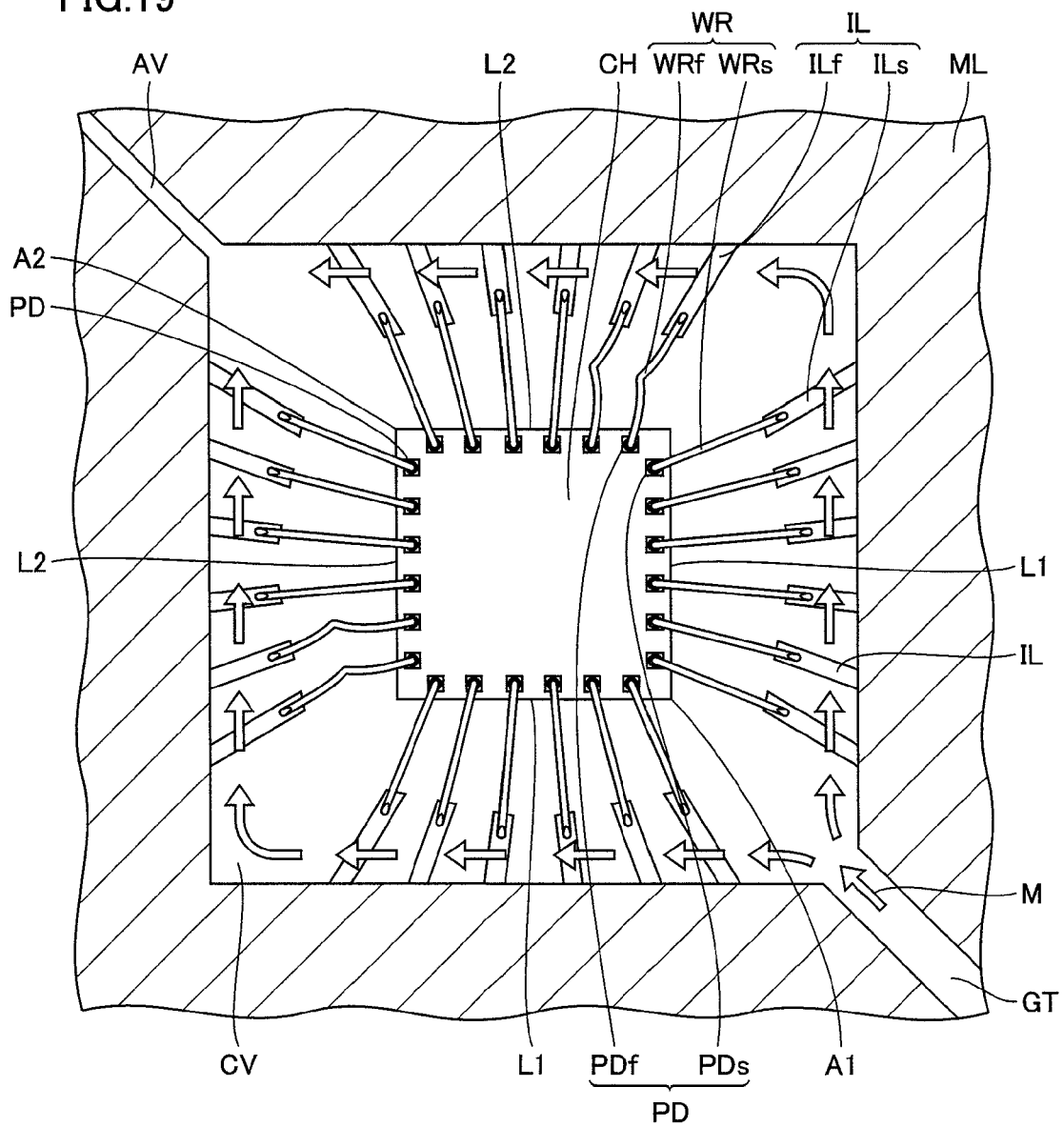
FIG. 19 is a cross section schematically illustrating a step of a method of manufacturing a semiconductor device in a modification of the first embodiment of the present invention.

Referring to FIG. 19, a semiconductor device of the modification includes, similarly to the first embodiment, a semiconductor chip CH, a plurality of inner leads IL (a group of electrodes), a plurality of bonding wires WR (a group of wires), and a resin portion MR (not shown in FIG. 19). Semiconductor chip CH has a main surface in the shape of a quadrilateral such as rectangle, for example, and a plurality of bonding pads PD (a group of pads) provided on the main surface. Bonding wire WR connects bonding pad PD and inner lead IL. Resin portion MR encapsulates bonding wires WR.

A plurality of bonding pads PD includes at least one specific pad PDf (first pad) and a standard pad PDs (third pad). Specific pad PDf is one of bonding pads that are arranged along second side L2 on the main surface of semiconductor chip CH, among a plurality of bonding pads PD, and is positioned relatively closer to first vertex A1, namely relatively further from second vertex A2. Standard pad PDs refers to bonding pads except for specific pad PDf among a plurality of bonding pads PD.

A plurality of inner leads IL includes at least one specific lead ILf (first electrode) and a standard lead ILs (second electrode). Specific lead ILf is one of inner leads arranged along second side L2, among a plurality of inner leads IL, and is positioned relatively closer to first vertex A1, namely relatively further from second vertex A2. Standard lead ILs refers to inner leads except for specific lead ILf among a plurality of inner leads IL.

A plurality of bonding wires WR includes at least one specific wire WRf (first wire) and a standard wire WRs (second wire). Specific wire WRf is one of bonding wires arranged to cross second side L2 as seen in plan view (FIG. 19), among a plurality of bonding wires WR, and is positioned relatively closer to first vertex A1, namely relatively further from second vertex A2. Standard wire WRs refers to bonding wires except for specific wire WRf among a plurality of bonding wires WR.

A method of manufacturing a semiconductor device of the modification will now be described.

First, a wire bonding process is performed. Specifically, bonding wires WR are formed respectively between a plurality of bonding pads PD and a plurality of inner leads IL. More specifically, the process includes the step of forming standard wire WRs between standard pad PDs and standard lead ILs and the step of forming specific wire WRf between specific pad PDf and specific lead ILf.

Specific wire WRf of bonding wires WR is bonded similarly to bonding wire WR (FIG. 10) of the above-described embodiment. Specifically, a first wire is formed so that the first wire extends on the side relatively further from first vertex A1 (namely the side relatively closer to second vertex A2), with respect to the straight line joining specific pad PDf and specific lead ILf as seen in plan view.

In contrast, standard wire WRs of bonding wires WR is bonded similarly to bonding wire WZ (FIG. 15) of the above-described comparative example. Specifically, before the liquid resin is poured, standard wire WRs is not inclined with respect to the main surface of semiconductor chip CH and thus standard wire WRs is linear in plan view as shown in FIG. 19.

Then, a liquid resin is poured and cured to obtain the semiconductor device of the modification, in a similar manner to the above-described embodiment.

The function and effect of the present modification will now be described.

Referring to FIG. 19, blank arrows M include those bent at a right angle. As indicated by the bent arrows, the liquid resin immediately after changing the direction of flow from the direction along first side L1 to the direction along second side L2 flows with an increased momentum. According to the present modification, specific wire WRf shaped similarly to the above-described embodiment is placed at the position subjected to the flow of the liquid resin with the increased momentum. Thus, contact of bonding wires WR due to the flow of the liquid resin with the increased momentum can be prevented like the above-described embodiment.

In contrast, standard wire WRs, namely a wire shaped in a more general manner may be provided at the position subjected to the relatively gentler flow of liquid resin.

Second Embodiment

Figure 20:
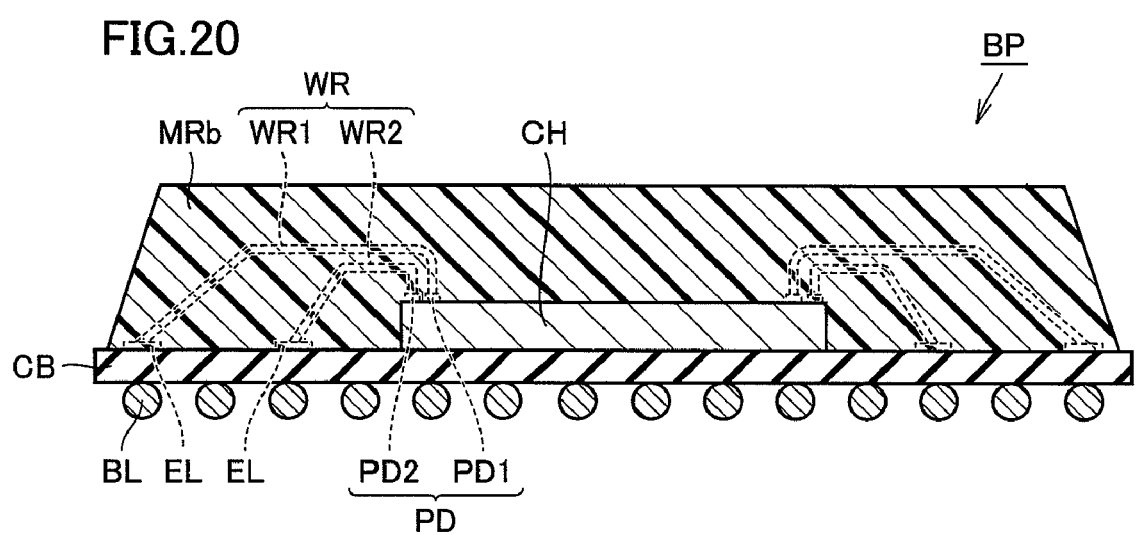
FIG. 20 is a cross section schematically showing a structure of a semiconductor device in a second embodiment of the present invention.
Figure 21:
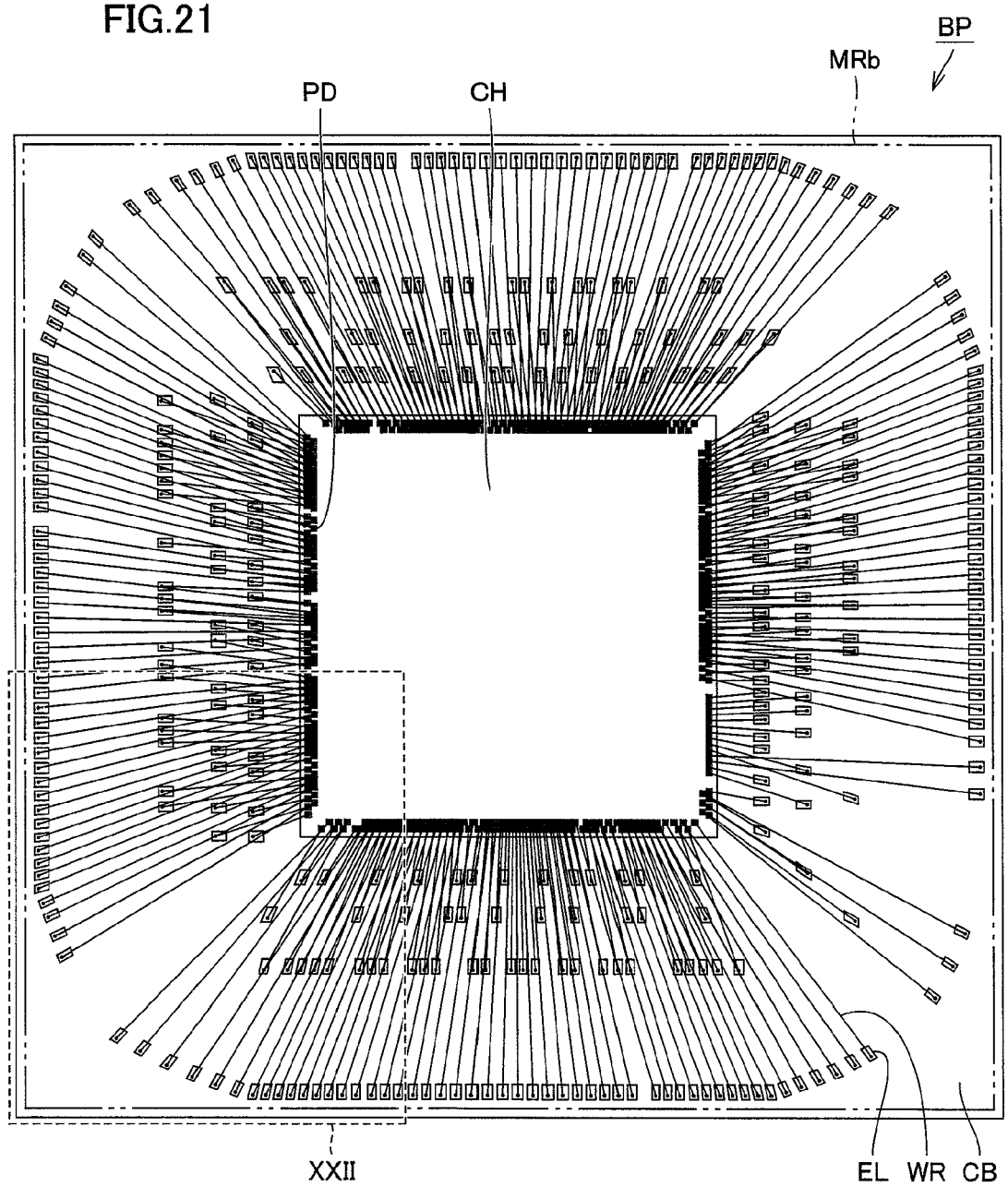
FIG. 21 is a plan view schematically showing an inner structure of a resin portion in FIG. 20.
Figure 22:
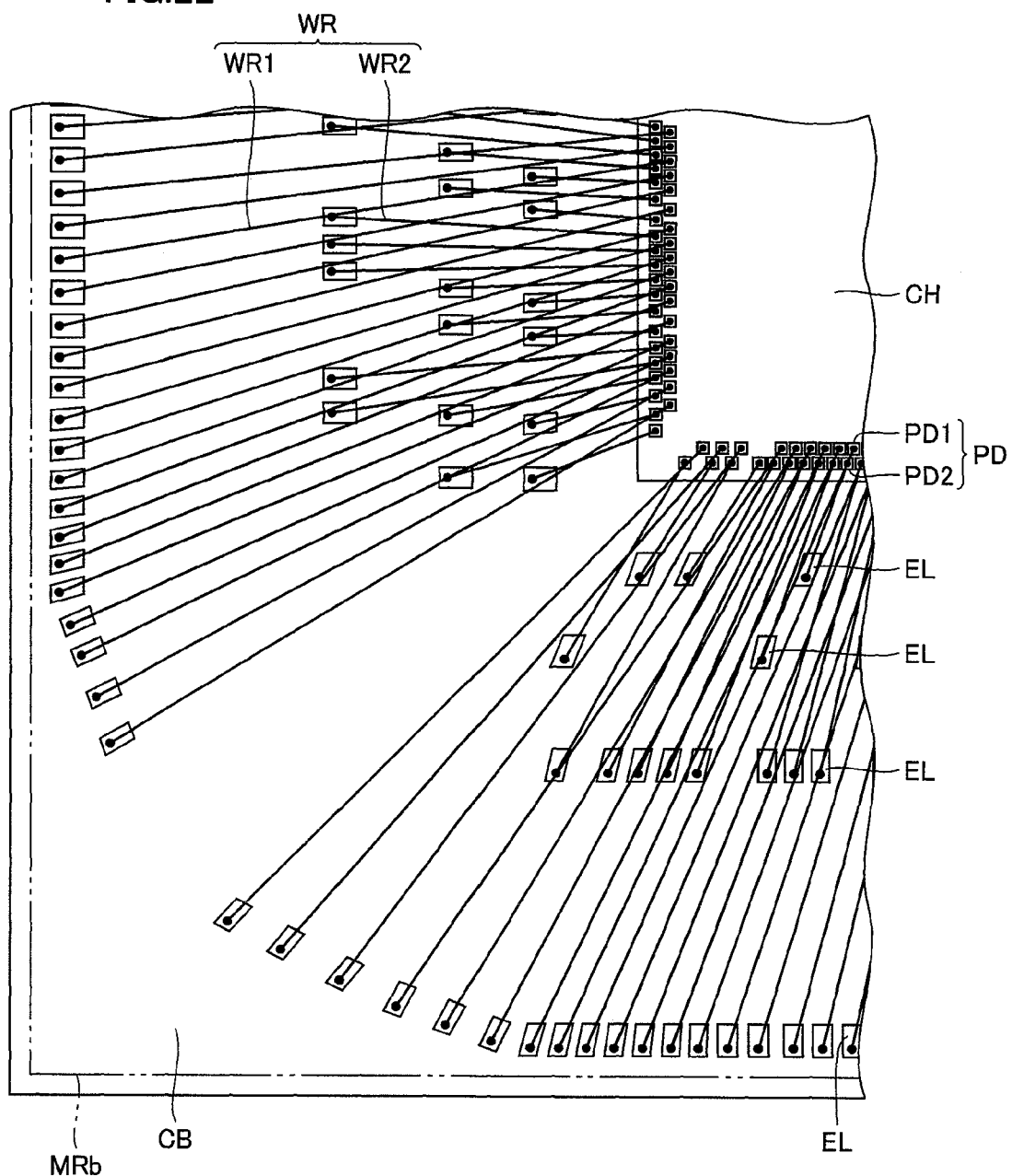
FIG. 22 is a schematic enlarged view of an area defined by broken line XXII in FIG. 21.

Referring to FIGS. 20 to 22, a semiconductor device in the present embodiment is a BGA (Ball Grid Array) type plastic package BP. Package BP includes, instead of lead frame LF (first embodiment), an electrode EL, a substrate CB and a solder ball BL. Package BP also includes a resin portion MRb instead of resin portion MR (first embodiment).

Electrode EL and semiconductor chip CH are connected by bonding wire WR. Semiconductor chip CH and electrode EL are each supported by substrate CB. Resin portion MRb encapsulates bonding wire WR and semiconductor chip CH.

Figure 23:
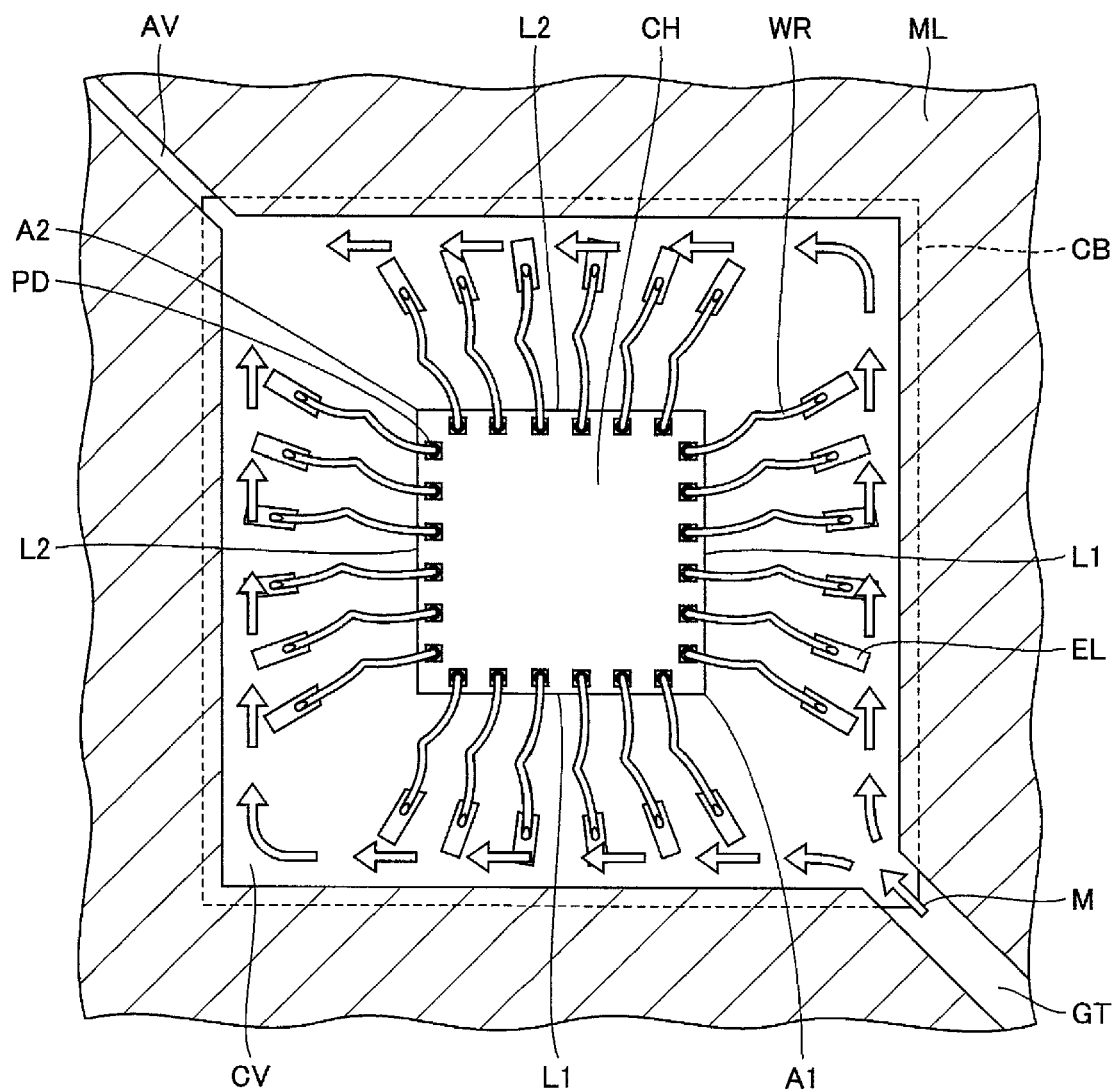
FIG. 23 is a cross section schematically illustrating a step of a method of manufacturing a semiconductor device in the second embodiment of the present invention.

Referring to FIG. 23, according to a method of manufacturing a semiconductor device in the present embodiment as well, bonding wire WR is formed and a liquid resin is poured (in the direction of arrow M) similarly to the first embodiment as described above.

The components other than the above-described ones are similar to those of the first embodiment as described above. Like or corresponding components are therefore denoted by like reference characters and the description thereof will not be repeated.

The present embodiment can also achieve the effects similar to those of the first embodiment.

According to the present embodiment, package BP includes substrate CB supporting semiconductor chip CH and electrode EL each. A BGA package having substrate CB can thus be formed.

A modification of the present embodiment will now be described.

Figure 24:
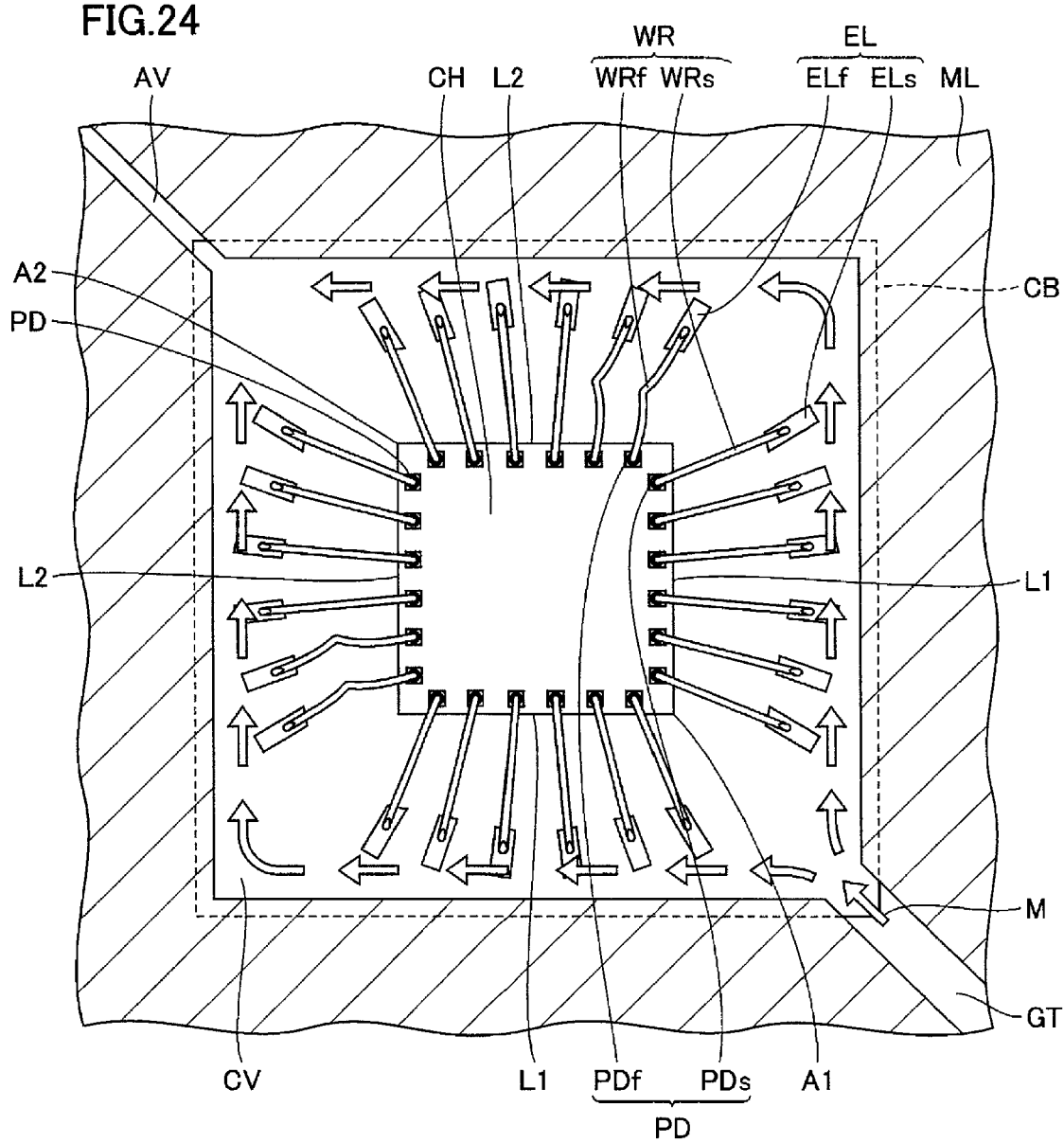
FIG. 24 is a cross section schematically illustrating a step of a method of manufacturing a semiconductor device in a modification of the second embodiment of the present invention.

Referring to FIG. 24, a plurality of bonding pads PD includes, like the modification (FIG. 19) of the first embodiment, at least one specific pad PDf (first pad) and a standard pad PDs (third pad).

A plurality of electrodes EL (a group of electrodes) includes at least one specific electrode ELf (first electrode) and a standard electrode ELs (second electrode). Specific electrode ELf is one of electrodes arranged along second side L2 among a plurality of electrodes EL, and is placed at a position relatively closer to first vertex A1, namely relatively further from second vertex A2. Standard electrode ELs refers to electrodes except for specific electrode ELf among a plurality of electrodes EL.

A plurality of bonding wires WR includes at least one specific wire WRf (first wire) and a standard wire WRs (second wire). Specific wire WRf is one of wires arranged in the direction crossing second side L2 as seen in plan view (as seen in FIG. 24) among a plurality of wires WR, and placed at a position relatively closer to first vertex A1, namely relatively further from second vertex A2. Standard wire WRs refers to wires except for specific wire WRf among a plurality of bonding wires WR.

According to the present modification, similar effects to those of the modification of the first embodiment can be achieved for BGA type plastic package BP as a semiconductor device.

Third Embodiment

Another method of manufacturing a semiconductor device (FIGS. 20 to 22) similar to that of the second embodiment will be described according to the present embodiment.

Figure 25:
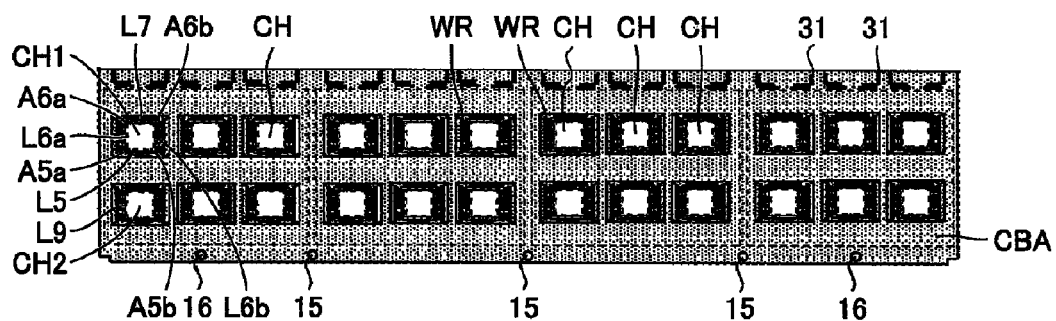
FIG. 25 is a top view schematically illustrating a step of a method of manufacturing a semiconductor device in a third embodiment of the present invention.
Figure 26:
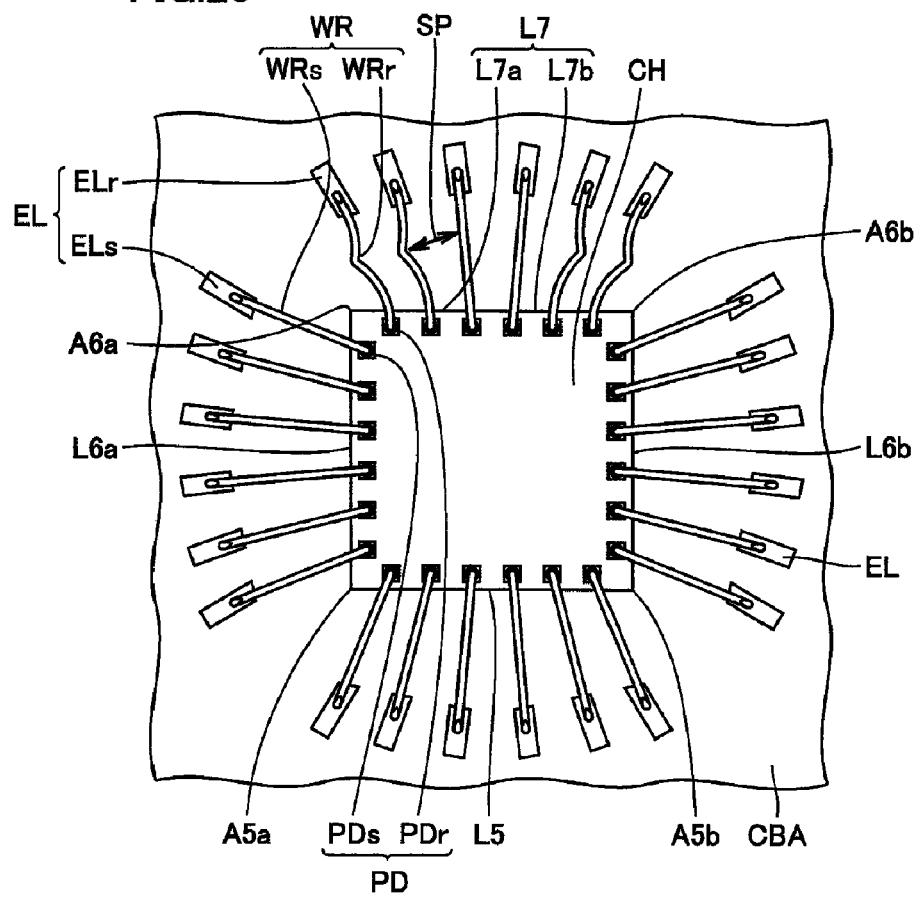
FIG. 26 is an enlarged view of a part of FIG. 25.

Referring to FIGS. 25 and 26, a substrate board CBA is prepared first. Substrate board CBA corresponds to a plurality of substrates CB (FIGS. 20 to 22) integrated together. Thus, substrate board CBA may be cut after a resin encapsulation process as described later to obtain a plurality of semiconductor devices having respective substrates CB. Substrate board CBA includes the portions to be used as substrates CB and the portions are each provided with a plurality of electrodes EL. Substrate board CBA includes, on the upstream side of a flow of a liquid resin to be poured as described later, a positioning hole 15 and a taper pin hole 16, and includes, on the downstream side, a groove 31 serving as an air vent.

A plurality of semiconductor chips CH is prepared. Here, for the sake of convenience of description, a semiconductor chip CH1 (first semiconductor chip) and a semiconductor chip CH2 (second semiconductor chip) located upstream of semiconductor chip CH1 with respect to the flow of a liquid resin to be poured that are included in a plurality of semiconductor chips CH will be particularly described in detail.

Semiconductor chip CH1 has a rectangular main surface, and the main surface has a first side L6a, a second side L7, a third side L6b, and a fourth side L5. First side L6a and second side L7 share a vertex A6a. Second side L7 and third side L6b share a vertex A6b. Third side L6b and fourth side L5 share a vertex A5b. Fourth side L5 and first side L6a share a vertex A5a.

On the main surface, a plurality of bonding pads PD (a group of pads) is provided. A plurality of bonding pads PD includes at least one specific pad PDr (first pad) and a standard pad PDs (third pad). Specific pad PDr is one of pads that are arranged along second side L7 on the main surface of semiconductor chip CH1, among a plurality of bonding pads PD, and is placed in a portion L7a located relatively closer to vertex A6a (namely relatively further from vertex A6b). Standard pad PDs refers to pads except for specific pad PDr among a plurality of bonding pads PD.

Semiconductor chip CH2 is structured similarly to semiconductor chip CH1. For the sake of convenience of description, one of the sides of the main surface of semiconductor chip CH2 that corresponds to first side L6a of semiconductor chip CH1 will be referred to as fifth side L9.

Then, a plurality of semiconductor chips CH is attached onto substrate board CBA with an adhesive layer therebetween. The semiconductor chips are attached in such a way as to align semiconductor chips CH1 and CH2 and align first side L6a of semiconductor chip CH1 and fifth side L9 of semiconductor chip CH2.

Subsequently, bonding wire WR is formed between bonding pad PD and electrode EL. Accordingly, specific wire WRr which is one of bonding wires WR is formed between specific pad PDr of semiconductor chip CH1 and specific electrode ELr. Further, standard wire WRs which is also one of bonding wires WR is formed between standard pad PDs of semiconductor chip CH1 and standard electrode ELs.

Specific wire WRr crosses second side L7, particularly portion L7a of second side L7 that is located relatively closer to vertex A6a as seen in plan view. Specific wire WRr has the shape protruding toward vertex A6a as seen in plan view. Namely, specific wire WRr extends on the side relatively closer to vertex A6a with respect to the straight line joining specific pad PDr and specific electrode ELr.

In contrast, standard wire WRs is linear in shape in plan view like the modification of the second embodiment.

Specific wire WRr and standard wire WRs thus have respective shapes different from each other, so that a relatively larger space SP between specific wire WRr and standard wire WRs (linear wire in plan view) is ensured.

Among bonding wires WR, a wire that crosses a portion L7b of second side L7 that is located relatively closer to vertex A6b is formed to protrude toward vertex A6b in plan view as shown in FIG. 26.

Figure 27:
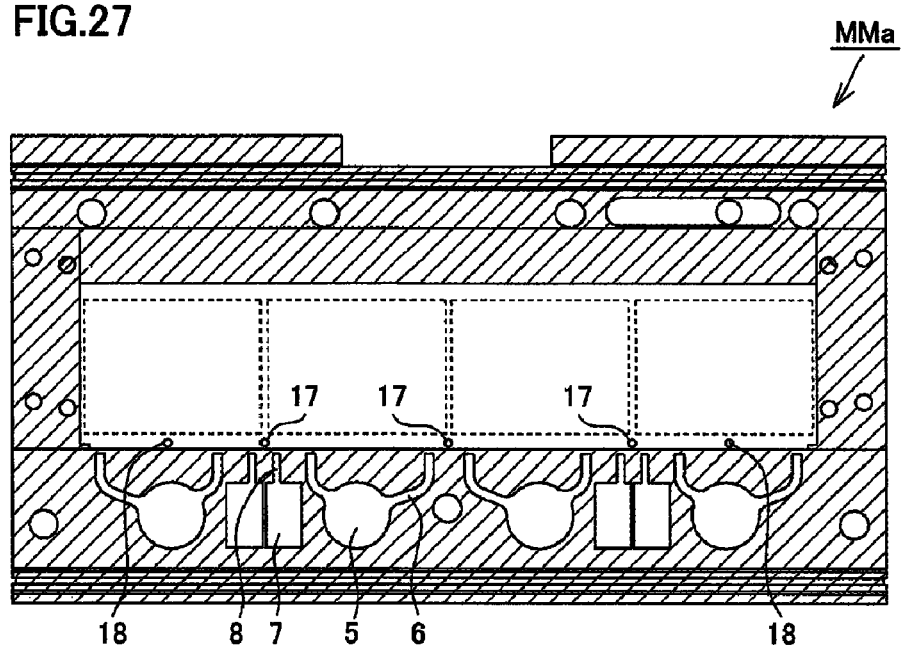
FIG. 27 is a cross section schematically showing an upper mold used for the method of manufacturing a semiconductor device in the third embodiment of the present invention.
Figure 28:
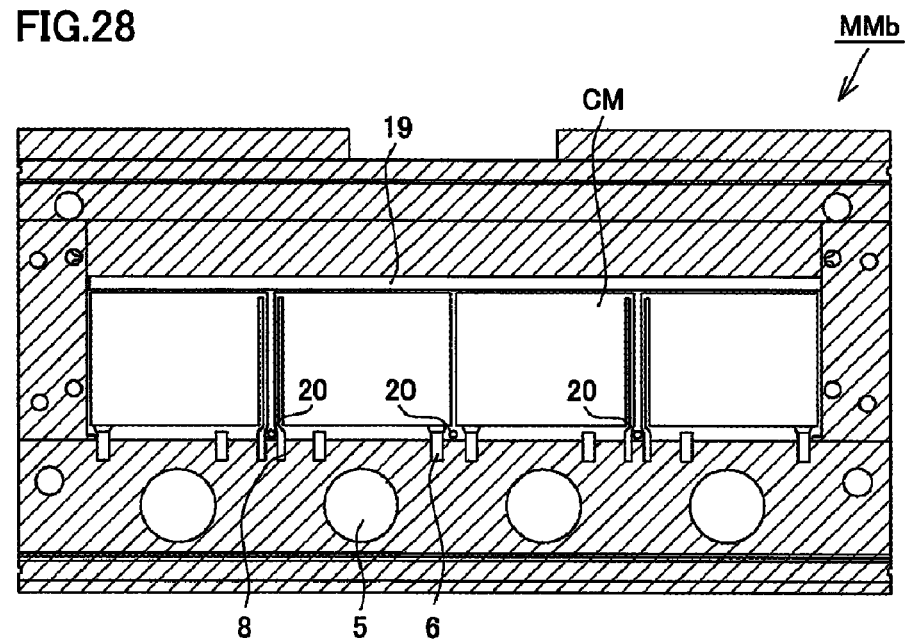
FIG. 28 is a cross section schematically showing a lower mold used for the method of manufacturing a semiconductor device in the third embodiment of the present invention.

Referring to FIGS. 27 and 28, an upper mold MMa includes a cull 5, a part of a cull side runner 6, an overflow cavity 7, a part of overflow cavity runner 8, a positioning pin receptacle 17, and a taper pin 18. A lower mold MMb includes a cull 5, a part of cull side runner 6, a part of overflow cavity runner 8, a depressed portion 19 where substrate board CBA is to be placed, a cavity CM, and a positioning pin 20.

Figure 29:
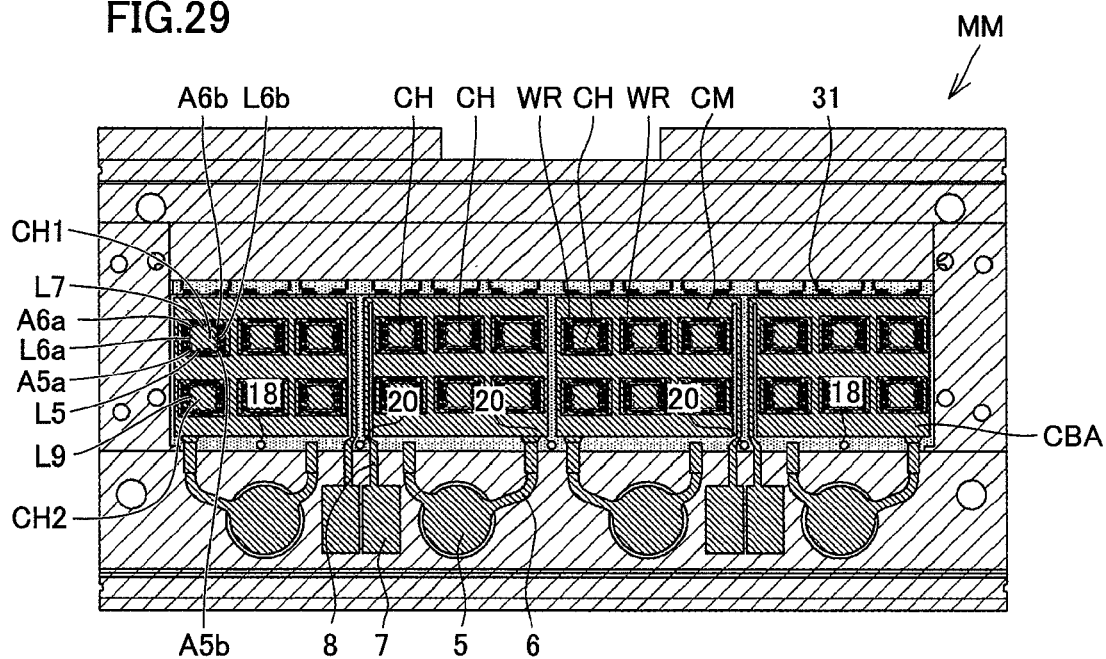
FIG. 29 is a schematic diagram illustrating a second step of the method of manufacturing a semiconductor device in the third embodiment of the present invention.
Figure 30:
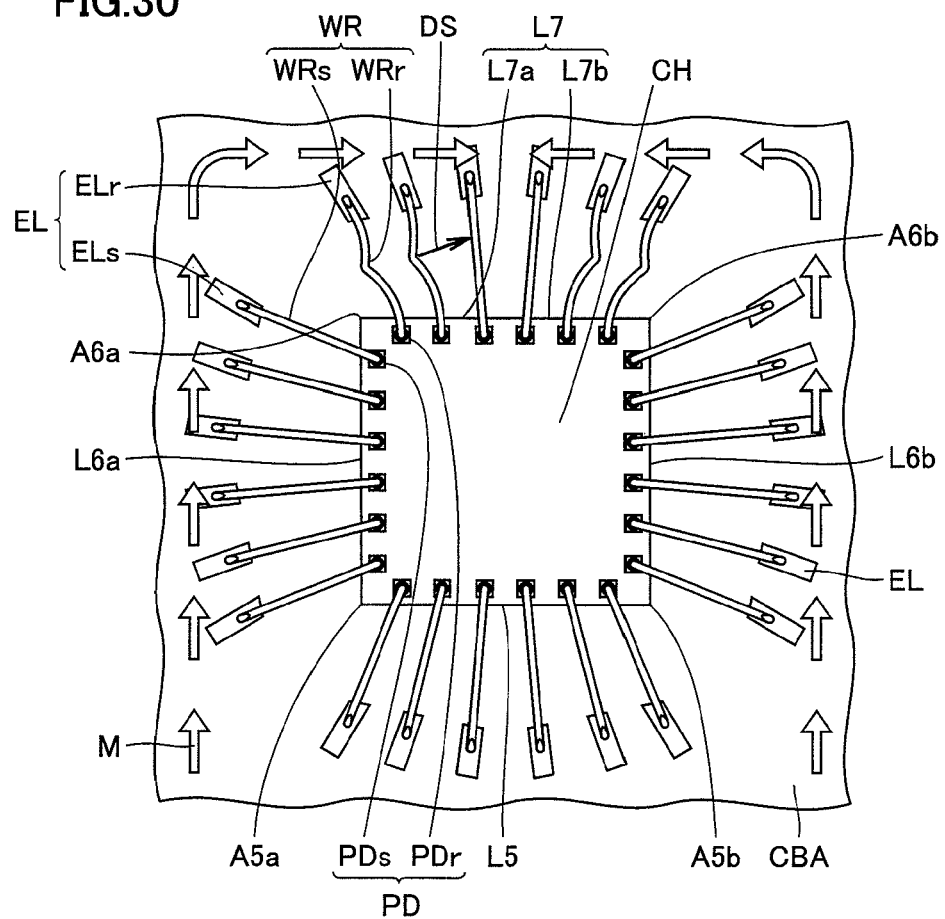
FIG. 30 is an enlarged view of a part of FIG. 29.

Referring to FIGS. 29 and 30, substrate board CBA is placed in depressed portion 19 of lower mold MMb so that semiconductor chip CH is positioned in cavity CM. Namely, semiconductor chips CH1 and CH2 are simultaneously set in cavity CM.

Then, with substrate board CBA held between lower mold MMb and upper mold MMa, a liquid resin is poured into cavity CM from cull 5 through cull side runner 6. Thus, semiconductor chips CH1 and CH2 are simultaneously encapsulated in the resin.

In the process of pouring the liquid resin, the liquid resin first passes the position along fifth side L9 (FIG. 29) of semiconductor chip CH2, and then passes the position along first side L6a and vertex A6a in this order to the position along the second side to reach portion L7a of the second side as indicated by arrow M (FIG. 30).

Then, the liquid resin is cured to produce a resin structure corresponding to a plurality of resin portions MR (FIG. 20) integrated together. The integrated resin structure is thereafter cut together with substrate CBA to obtain a semiconductor device similar to that of the second embodiment (FIGS. 20 to 22).

The function and effect of the present embodiment will now be described.

Referring to FIG. 30, blank arrows M include those bent at a right angle. As indicated by the bent arrows, the liquid resin immediately after changing the direction of flow from the direction along first side L6a to the direction along second side L7, around vertex A6a, flows with an increased momentum. According to the present embodiment, a relatively large space SP (FIG. 26) can be ensured between bonding wires. Thus, contact of specific wire WRr and standard wire WRs separated by relatively large space SP due to displacement DS (FIG. 30) of specific wire WRr caused by the liquid resin can be prevented.

In contrast, standard wire WRs, namely a wire shaped in a more general manner may be provided at the position subjected to the relatively gentler flow of the liquid resin.

The components other than the above-described ones are similar to those of the second embodiment as described above. Like or corresponding components are therefore denoted by like reference characters and the description thereof will not be repeated.

It should be noted that "rectangle" herein refers to the shape of a quadrilateral whose four angles at respective corners are all right angles and therefore includes square.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method of manufacturing a semiconductor device comprising: a semiconductor chip including a quadrilateral main surface having first and second vertices on a diagonal line and first and second sides connecting said first and second vertices, and including a group of pads on said main surface; a group of electrodes; a group of wires connecting said group of pads and said group of electrodes; and a resin portion encapsulating said group of wires, said method comprising the steps of:

forming said group of wires between said group of pads and said group of electrodes, said step of forming said group of wires including forming a first wire of said group of wires between a first pad of said group of pads and a first electrode of said group of electrodes;

enclosing said group of wires in a cavity of a mold;

pouring a liquid resin into said cavity such that said liquid resin flows from said first vertex toward said second vertex along said first and second sides; and forming said resin portion by curing said liquid resin, said first wire being formed such that said first wire crosses said second side of said main surface and has a portion bent toward said second vertex relative to a straight line connecting said first pad and said first electrode as seen in a plan view, wherein said step of forming said group of wires includes forming a second wire of said group of wires between a second pad of said group of pads and a second electrode of said group of electrodes, and said second wire is formed such that the entire second wire extends on a straight line connecting said second pad and said second electrode as seen in the plan view.

2. The method of manufacturing a semiconductor device according to claim 1, wherein said semiconductor chip includes a third pad provided on said main surface, and the distance between said third pad and an outer perimeter of said main surface is smaller than the distance between said first pad and said outer perimeter.

3. The method of manufacturing a semiconductor device according to claim 1, wherein each electrode of said group of electrodes includes a portion protruding from said resin portion.

4. The method of manufacturing a semiconductor device according to claim 1, wherein said semiconductor device includes a substrate supporting said semiconductor chip and each electrode of said group of electrodes.

5. A method of manufacturing a semiconductor device comprising: a first semiconductor chip including a quadrilateral main surface having first and second sides sharing a common vertex and including a group of pads on said main surface; a group of electrodes; a group of wires connecting said group of pads and said group of electrodes; and a resin portion encapsulating said group of wires, said method comprising the steps of:

forming said group of wires between said group of pads and said group of electrodes, said step of forming said group of wires including the step of forming a first wire of said group of wires between a first pad of said group of pads and a first electrode of said group of electrodes, said first wire crossing said second side as seen in plan view;

enclosing said group of wires in a cavity of a mold;

pouring a liquid resin into said cavity, said step of pouring the liquid resin being performed such that said liquid resin flows to a position along said second side via a position along said first side and a position around said vertex in order; and forming said resin portion by curing said liquid resin, said step of forming said first wire being performed by forming said first wire such that said first wire crosses said second side and extends on a side relatively closer to said vertex with respect to a straight line connecting said first pad and said first electrode as seen in plan view.

6. The method of manufacturing a semiconductor device according to claim 5, wherein
said first semiconductor chip includes a second pad provided on said main surface, and the distance between said second pad and an outer perimeter of said main surface is smaller than the distance between said first pad and said outer perimeter.

7. The method of manufacturing a semiconductor device according to claim 5, wherein
said semiconductor device includes a substrate supporting said first semiconductor chip and each electrode of said group of electrodes.

8. The method of manufacturing a semiconductor device according to claim 5, wherein
said step of forming said group of wires includes the step of forming a second wire of said group of wires between a third pad of said group of pads and a second electrode of said group of electrodes, and
said step of forming the second wire is performed by forming said second wire such that said second wire extends along a straight line connecting said third pad and said second electrode as seen in plan view.

9. The method of manufacturing a semiconductor device according to claim 5, wherein
said cavity is formed such that said cavity allows said first semiconductor chip and a second semiconductor chip to be simultaneously set in said cavity, and
said step of pouring the liquid resin is performed such that said liquid resin flows to a position along said first side via a position along a third side of said second semiconductor chip.

10. The method of manufacturing a semiconductor device according to claim 1, wherein among a plurality of wires crossing said second side of said main surface as seen in the plan view, said first wire is disposed relatively nearest to said first side of said main surface.

11. The method of manufacturing a semiconductor device according to claim 1, wherein said second wire crosses said first side of said main surface as seen in the plan view.

12. The method of manufacturing a semiconductor device according to claim 1, wherein among a plurality of wires crossing said second side of said main surface as seen in the plan view, said second wire is disposed relatively furthest from said first side of said main surface.

13. The method of manufacturing a semiconductor device according to claim 1, wherein said first wire is formed so as to have:
a first portion extending from said first pad, in a direction substantially perpendicular to said first pad, to a first bend at a first height above said main surface of said semiconductor chip;
a second portion extending from said first bend through a second bend at a second height above said main surface, to said portion bent toward said second vertex at a third height above said main surface; and
a third portion extending from said portion bent toward said second vertex to said first electrode,
wherein said second portion extends along a plane that is inclined with respect to a line normal to said main surface of said semiconductor chip, and
wherein said second height is greater than said third height, and said third height is greater than said first height.

* * * * *